United States Patent
Miyamae et al.

(10) Patent No.: US 6,866,969 B2
(45) Date of Patent: Mar. 15, 2005

(54) PHOTOMASK, MICROSTRUCTURE, MANUFACTURING METHOD OF PHOTOMASK, AND ALIGNER

(75) Inventors: Akira Miyamae, Fujimi-machi (JP); Kimio Nagasaka, Nirasaki (JP)

(73) Assignee: Seiko Epson Corporation (JP)

( * ) Notice: Subject to any disclaimer, the term of this patent is extended or adjusted under 35 U.S.C. 154(b) by 179 days.

(21) Appl. No.: 10/261,170

(22) Filed: Sep. 30, 2002

(65) Prior Publication Data
US 2003/0096176 A1 May 22, 2003

(30) Foreign Application Priority Data
Oct. 1, 2001 (JP) ........................................ 2001-305747
Feb. 13, 2002 (JP) ........................................ 2002-036055

(51) Int. Cl.[7] ................................................. G03F 9/00
(52) U.S. Cl. ................................................................ 430/5
(58) Field of Search ................................. 430/5, 311, 313

(56) References Cited

U.S. PATENT DOCUMENTS 5,786,116 A * 7/1998 Rolfson ........................ 430/5
6,057,065 A * 5/2000 Rolson ......................... 430/5
6,379,868 B1 * 4/2002 White ......................... 430/311

FOREIGN PATENT DOCUMENTS

JP  05-142752  6/1993
JP  05-224398  9/1993

* cited by examiner

*Primary Examiner*—S. Rosasco
(74) *Attorney, Agent, or Firm*—Harness, Dickey & Pierce, P.L.L.C.

(57) ABSTRACT

Provided is a photomask enabling accurate tone representation. This photomask has a transparent substrate (42), and a phase grating structured from a plurality of grooves of a fixed pitch (P) formed on said substrate, wherein at least either the depth or width of the respective grooves of the phase grating is made to bear the exposure pattern. And, when the wavelength of the exposed light of the aligner employing the photomask is set to λ, and the incident side numerical aperture of the imaging system lens is set to $NA_i$, $P<λ/NA_i$. Thereby, the grating will no longer be imaged, and the exposure pattern represented with the depth or width of the respective grooves of the phase grating will be transcribed on to a light sensitive material.

60 Claims, 33 Drawing Sheets

PHASE GRATING MASK PATTERN

PHOTOMASK, MICROSTRUCTURE, MANUFACTURING METHOD OF PHOTOMASK, AND ALIGNER

BACKGROUND OF THE INVENTION

1. Field of the Invention

The present invention relates to a photomask enabling the exposure of a photo resist with a halftone and to an aligner employing such photomask. Moreover, the present invention further relates to a manufacturing method suitable for manufacturing a minute three-dimensional structure formed on the likes of a liquid crystal panel, semiconductor substrate, microelectronics mechanical system (MEMS) substrate, diffraction grating, hologram, optical communication device, among others.

2. Description of the Related Art

In an electro-optical device such as a liquid crystal display device, the use of a microstructure such as a directional reflector or a microlens array is being considered. A microstructure, for example, is used for controlling the transmitted light or reflected light with the minute irregularities formed on the surface thereof. Although it is possible to consider obtaining a desired curved surface by successively controlling the depth of exposure of the photo resist (photosensitive material) film in order to form a curved surface such as a minute lens or a concave mirror, the depth of exposure cannot be set with a standard transmissive or non-transmissive binary mask. Thus, a tone mask for exposing a halftone photo resist becomes necessary.

For instance, in Japanese Patent Laid-Open Publication No. H5-142752, even an intermediate tone representation (intermediate exposure) is realized by successively controlling the exposure upon gradually changing the density of the dots structuring the mask pattern in a binary mask.

SUMMARY OF THE INVENTION

Nevertheless, with a photomask that forms patterns with pointillism, the number of tones and the resolution are determined with the dot size and accuracy of positioning. With the currently available manufacturing equipment, margin of the dot pitch is approximately 0.7 $\mu$m, and margin of the position accuracy and resolving power is approximately 0.3 $\mu$m. The resolution will be 1 $\mu$m or more. Moreover, since the tone and dot density will not correspond simply as a result of the generation of unwanted diffracted light, complicated calculations are required for performing the exposure of accurate tone representation, which is troublesome.

Accordingly, an object of the present invention is to provide a photomask enabling a more accurate tone representation.

Further, another object of the present invention is to provide a manufacturing method capable of manufacturing a photomask enabling a more accurate tone representation.

Moreover, a further object of the present is to provide a manufacturing (exposing) device capable of manufacturing a photomask enabling a more accurate tone representation.

In addition, still another object of the present invention is to provide a microstructure manufactured with the foregoing photomask, manufacturing method, or manufacturing device.

In order to achieve the foregoing objects, a photomask of the present invention comprises: a transparent substrate; and a phase grating structured from a plurality of grooves of a fixed pitch formed on the substrate; wherein at least either the depth or width of the respective grooves of the phase grating bears the exposure pattern. This implies that that one among the depth, width or depth and width of the respective grooves of the phase grating bears the information in correspondence with the exposure pattern. More specifically, at least the size of either the depth or width of the respective grooves bears the information of the exposure pattern such that the projected light transmitted through this mask forms an exposure pattern on the material for exposure.

According to the foregoing structure, a photomask employing a phase grating (total transmissive diffraction grating) can be obtained. As a result of controlling the amount of transmitted light passing through the substrate with the groove or width of the phase grating, a photomask enabling a high resolution halftone exposure can be obtained.

Preferably, when the pitch is set to P, the wavelength of the exposed light of the aligner employing the photomask is set to $\lambda$, and the incident side numerical aperture of the imaging system lens is set to $NA_i$, $P<\lambda/NA_i$. Thereby, the groove pattern of the phase grating becomes less than the resolution of the imaging system lens, the groove itself of the phase grating is not formed (imaged) on the substrate for exposure, and a halftone pattern (pattern pursuant to density information) to be borne by the phase grating mask is formed.

Preferably, the cross section of the groove of the phase grating is of an approximate sinusoidal shape, and the phase depth in the exposed light of this groove is within the range of 0 to 1.5$\pi$. Moreover, the groove of the phase grating is of an approximate trapezoid shape, and the shape of this groove is within the range of a shape in which the 0 order optical transmittance becomes minimum in the wavelength of the exposed light from an approximate planar surface. As a result of setting the value within the foregoing range, the amount of transmitted light passing through the phase grating (mask) can be controlled with the depth and width of the groove.

Here, depth dp of the phase of the exposed light is represented with dp=$2\pi \cdot d \cdot |n_2-n_1|/\lambda$. d is the grating depth, $n_1$ is the refractive index of the grating periphery (ordinarily the refractive index of air (=1)), $n_2$ is the refractive index of the grating medium, and $\pi$ is the wavelength of the exposed light.

Preferably, the plurality of grooves of the phase grating is formed with rotational scanning. Thus, by successively conducting pattern scanning, a phase grating photomask may be manufactured easily with relatively favorable precision.

Preferably, with respect to the plurality of grooves of the phase grating, the depth or width of the grooves may be formed as a result of modulating the intensity of the scanning beam.

Preferably, with respect to the plurality of grooves of the phase grating, the depth or width of the grooves is formed by repeated irradiation with one or a plurality of scanning beams for forming one groove, or by increasing the scanning density with one or a plurality of scanning beams for forming one groove. As a result of using a plurality of scanning beams, the depth and width of the groove, and the controllable range of the depth and width of the groove, will expand.

Moreover, the microstructure of the present invention comprises: a transparent substrate; and a phase grating structured from a plurality of grooves of a fixed pitch formed on the substrate; wherein the microstructure is formed to correspond to the tone of the pattern to be displayed with at least either the depth or width of the respective grooves of the phase grating.

According to the foregoing structure, a microstructure having a pattern represented with a halftone can be obtained. For instance, the microstructure may include a photomask, diffraction grating, hologram, display medium of a graphic expression object, or indicator of logos and marks.

Moreover, the manufacturing method of a phase grating mask of the present invention comprises: a step for forming a resist on a mask substrate; an exposure step for forming on the resist a latent image of the phase grating mask containing a plurality of grooves in prescribed intervals; a development step for developing the resist and forming a phase grating resist; and a transcription step for transcribing the shape of the phase grating resist on the mask substrate; wherein the exposure step scans the resist and sets the depth of the exposure groove formed on the resist with the exposure beam in which the intensity thereof has been modulated in correspondence with the pattern of the phase grating mask.

Preferably, the resist is a positive type, and the amount of exposure of the exposure beam is controlled to be within a range from a luminous exposure in which the 0 order transmittance of the prepared phase grating becomes minimum to a luminous exposure in which the 0 order transmittance becomes maximum.

Preferably, the resist is a positive type, and the amount of exposure of the exposure beam is controlled to be within a range from a luminous exposure in which the 0 order transmittance of the prepared phase grating becomes minimum to a luminous exposure in which the resist is eliminated in its approximate entirety pursuant to the development thereof.

Moreover, the manufacturing method of a phase grating mask of the present invention comprises: a step for forming a resist on a mask substrate; an exposure step for forming on the resist a latent image of the phase grating mask containing a plurality of grooves in prescribed intervals; a development step for developing the resist and forming a phase grating resist; and a transcription step for transcribing the shape of the phase grating resist on the mask substrate; wherein the exposure step scans the resist and sets the depth of the exposure groove formed on the resist with at least two exposure beams in which is provided an intensity difference in correspondence with the pattern of the phase grating mask.

As a result of setting the groove depth with the foregoing two beams provided intensity difference, the forming of the groove may be controlled more accurately.

Preferably, among the two exposure beams, a first exposure groove having a first depth is formed with a first exposure beam, a second exposure groove having a second depth is formed with a second exposure beam, and the depth of the exposure grooves is relatively set according to the difference in the formed position of the first and second exposure grooves.

Preferably, among the two exposure beams, the first exposure beam is maintained at a fixed intensity, and the intensity of the second exposure beam is modulated in correspondence with the pattern of the phase grating mask.

Preferably, among the two exposure beams, the first exposure beam forms an exposure groove of a fixed depth in the resist, and the second exposure beam sets the height of the land portion adjacent to this exposure groove.

Preferably, the respective intensities of the two exposure beams are independently set, and these two exposure beams simultaneously scan the resist.

Preferably, the first and second exposure beams are obtained by changing the mode upon setting the intensity of one exposure beam for each scanning.

Preferably, the spot diameter of the exposure beam is smaller than the groove interval of the phase grating mask and larger than ½ of the groove interval. The groove intervals of the mask may thereby be completely exposed.

Moreover, the manufacturing method of a phase grating mask of the present invention comprises: a step for forming a resist on a mask substrate; an exposure step for forming on the resist a latent image of the phase grating mask containing a plurality of grooves in prescribed intervals; a development step for developing the resist and forming a phase grating resist; and a transcription step for transcribing the shape of the phase grating resist on the mask substrate; wherein the exposure step scans the resist with the two exposure beams, sets the interval of the two exposure beams for irradiating the resist in correspondence with the pattern of the phase grating mask, and sets the width of the exposure groove formed on the resist.

According to the foregoing structure, the width of the exposure beam may be, in essence, set variably.

Moreover, the manufacturing method of a phase grating mask of the present invention comprises: a step for forming a resist on a mask substrate; an exposure step for forming on the resist a latent image of the phase grating mask containing a plurality of grooves in prescribed intervals; a development step for developing the resist and forming a phase grating resist; and a transcription step for transcribing the shape of the phase grating resist on the mask substrate; wherein the exposure step scans the resist with the two exposure beams, sets the angle formed with the two exposure beams for irradiating the resist in correspondence with the pattern of the phase grating mask, and sets the depth and width of the exposure groove formed on the resist.

According to this structure, the depth and width of the groove formed with the exposure beam may be set variably.

Preferably, the two exposure beams are obtained by changing the irradiation direction of one exposure beam for each scanning.

Preferably, the respective irradiation directions of the two exposure beams are set symmetrically, and these two exposure beams simultaneously scan the resist. Thereby, scanning can be completed in half the time.

Preferably, the intensity of both the first and second exposure beams is made large to form a shallow groove on the resist. Thereby, the residual quantity of the positive type photo resist after development thereof can be reduced, and the deformation of the mask by heat or the like can be decreased as a result thereof.

Preferably, the scanning is a rotational scanning system. There is an advantage in that it is not necessary to frequently repeat the movement/stoppage in comparison to a raster scan (parallel scanning), and scanning can be conducted with favorable precision and efficiently.

Preferably, the prescribed interval P of the plurality of grooves of the phase grating mask is set to $P<\lambda/NA_i$ when the wavelength of the exposed light of the aligner irradiating the phase grating mask is set to $\lambda$, and the incident side numerical aperture of the imaging system lens is set to $NA_i$.

Preferably, the cross section of the exposure groove formed on the resist is of an approximate sinusoidal shape, and the phase depth in the exposed light of this groove is within the range of 0 to $1.5\pi$.

Preferably, the groove of the phase grating is of an approximate trapezoid shape, and the shape of this groove is within the range of a shape in which the 0 order optical transmittance becomes minimum in the wavelength of the exposed light from an approximate planar surface.

Preferably, the resist is a positive type, and the amount of light exposed to this resist with the exposure beam is made to be within a range from a luminous exposure in which the 0 order transmittance of the prepared phase grating becomes minimum to a luminous exposure in which the 0 order transmittance becomes maximum. Thereby, 0 order transmittance having a broad range can be obtained.

Preferably, the resist is a positive type, and the amount of light exposed to this resist with the exposure beam is made to be within a range from a luminous exposure in which the 0 order transmittance of the prepared phase grating becomes minimum to a luminous exposure in which the resist is eliminated in its approximate entirety pursuant to the development thereof. Thereby, 0 order transmittance having a broad range can be obtained.

Moreover, the aligner of the present invention comprises: a phase grating photomask in which at least either the depth or width of the respective grooves of the phase grating bears the mask pattern; an exposure light source for irradiating the exposure light on the photomask; a material for exposure to which a light sensitive film is applied thereto; and projection means for condensing the 0 order light of the phase grating among the exposed light transmitted through the photomask on to the material for exposure. Preferably, when the pitch is set to P, the wavelength of the exposed light of the aligner employing the photomask is set to $\lambda$, and the incident side numerical aperture of the condensing (imaging) lens of the foregoing projection means is set to $NA_i$, $P<\lambda/NA_i$.

Preferably, the projection means projects only the 0 order light on to the material for exposure, and does not project any high order light above first order light; and the photomask determines the diffraction efficiency of the 0 order light with at least either the depth or width of the respective grooves of the phase grating, and provides an exposure tone in correspondence with the mask pattern to the light sensitive film.

Preferably, the cross section of the groove of the phase grating is of an approximate sinusoidal shape, and the phase depth in the exposed light of this groove is within the range of 0 to 1.5$\pi$. Thereby, the amount of transmitted light passing through the phase grating (mask) can be controlled with the groove depth.

Preferably, the groove of the phase grating is of an approximate trapezoid shape, and the shape of this groove is within the range of a shape in which the 0 order optical transmittance becomes minimum in the wavelength of the exposed light from an approximate planar surface.

According to the foregoing structure, pattern exposure may be conducted with a phase grating photomask. Further, a high resolution halftone exposure can be performed.

Preferably, a microstructure such as a microlens, reflecting plate, optical waveguide, photomask, crystal panel, semiconductor substrate, microelectronics mechanical system (MEMS) substrate, diffraction grating, hologram, optical communication device, or display medium of a graphic expression object is manufactured with the foregoing mask, manufacturing method of the mask, or aligner.

BRIEF DESCRIPTION OF THE DRAWINGS

The objects and advantages of the present invention will become more apparent from the following detailed explanation with reference to the drawings, wherein.

DESCRIPTION OF THE PREFERRED EMBODIMENTS

Embodiments of the present invention are now explained with reference to the drawings.

(First Embodiment)

Figure 1:
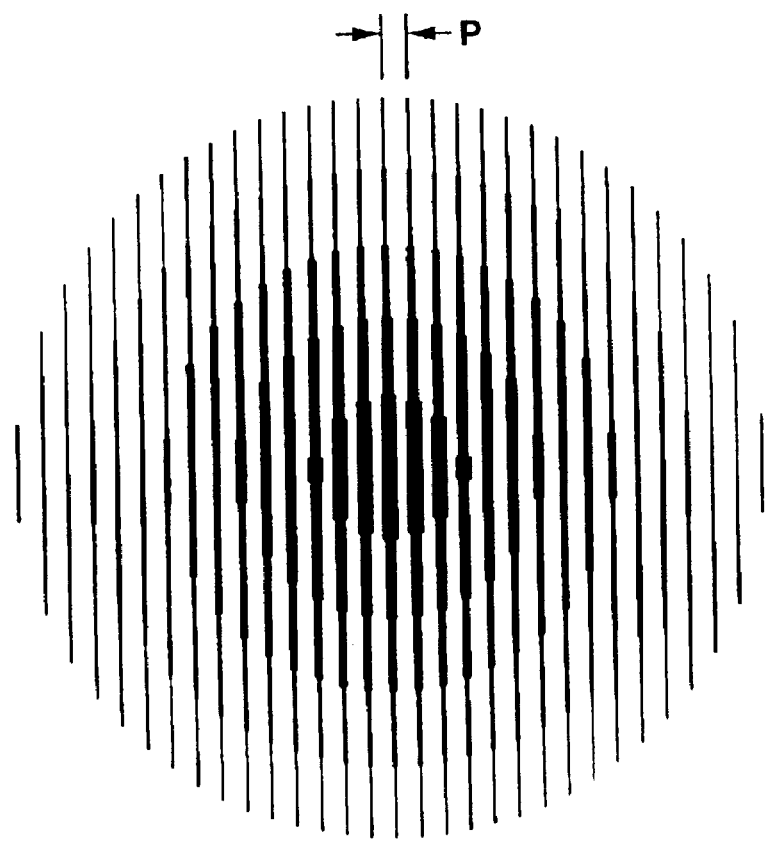
FIG. 1 is an explanatory diagram for explaining a phase grating photomask of the present invention.

FIG. 1 is an explanatory diagram for schematically explaining the photomask of the present invention.

The photomask illustrated in FIG. 1 is the phase grating mask. A photomask uses a transparent substrate (for example, a quartz substrate having a refractive index of 1.48). A plurality of grooves (phase gratings) is formed in the surface thereof in a prescribed interval (for example, 0.6 $\mu$m). The width or depth of this groove, or the width and depth of this groove bear the information of the mask pattern, and correspond to the pattern. In the illustrated example, a photomask pattern used for forming a microlens is shown, and, although the width and depth of the groove differ in certain areas, the depth of the groove in principle bears the information of the photomask pattern.

As described later, the maximum depth of the groove of the phase grating is the phase depth of 1.5$\pi$ (radian) in the exposed light of the aligner not shown. For example, in the case of an i line, according to the foregoing formula, when d=570 nm, dp=1.5$\pi$. Moreover, the cross section shape of the groove is of an approximate sinusoidal wave in the vicinity of the maximum depth. When exposure light is irradiated to this mask, light that passed through the mask is diffracted and branched to 0 order light, ±first order light, . . . In this example of the illustrated mask, the diffraction angle of the ±first order light becomes 35.6 degrees. With the aligner, drawing (exposure) of the mask pattern is conducted with the 0 order light among the transmitted exposure light.

Here, pitch P of the phase grating of the photomask is made smaller than the minimum resolving power D (=$\lambda$/NA) of the imaging optical system of the aligner. In other words, by setting P<D=$\lambda$/NA, the groove pattern itself of the phase grating is not transcribed with the imaging system of the aligner, and only the luminous energy distribution (mask pattern) of 0 order light is transcribed on the light sensitive substrate. The mask pattern information is thereby transcribed. As described above, $\lambda$ is the wavelength of the exposed light, and NA is the incident side numerical aperture of the imaging system lens.

Figure 2:
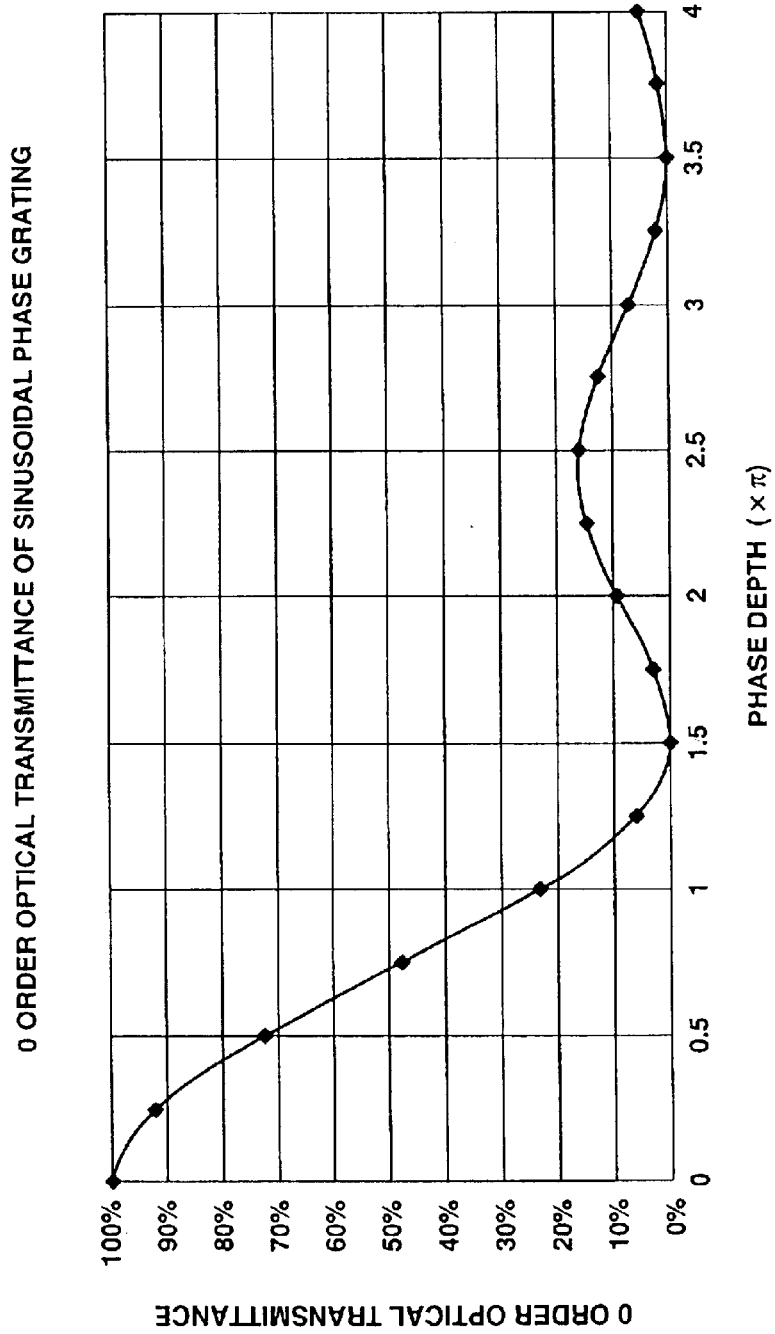
FIG. 2 is a graph for explaining the relationship of the depth of the grating groove (phase depth) in the phase grating and the transmission efficiency (diffraction efficiency) of the 0 order diffracted light.

FIG. 2 shows the results upon analyzing the relationship of the transmission efficiency (diffraction efficiency) and the phase depth (groove depth) of 0 order light of the phase grating, wherein the cross section shape of the groove thereof is of a sinusoidal shape, with fast Fourier transform (FFT). When the phase depth is 0$\pi$ (radian), 0 order optical transmittance is 100%, and, when 1.5$\pi$, 0 order optical transmittance is 0%. The phase depths therebetween are values according to the depth thereof. Thus, as a result of forming the groove depth of the phase grating in correspondence with the height of the irregularities of the pattern to be formed, the amount of light to be transmitted through the phase grating mask can be controlled. Moreover, as described later, the amount of light to be transmitted can also be controlled with the groove width of the phase grating.

Next, the manufacturing method of the phase grating mask is explained with reference to FIGS. 3 to 6.

Figure 3:
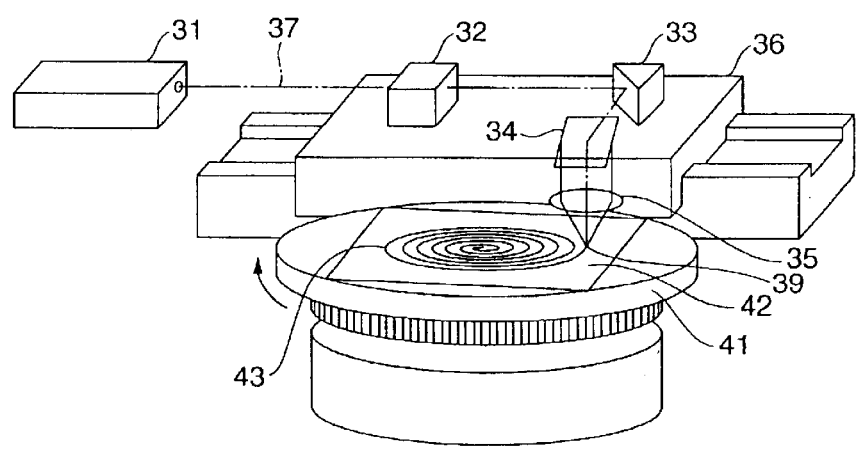
FIG. 3 is an aligner of the substrate for explaining the manufacture of a phase grating photomask.
Figure 4:
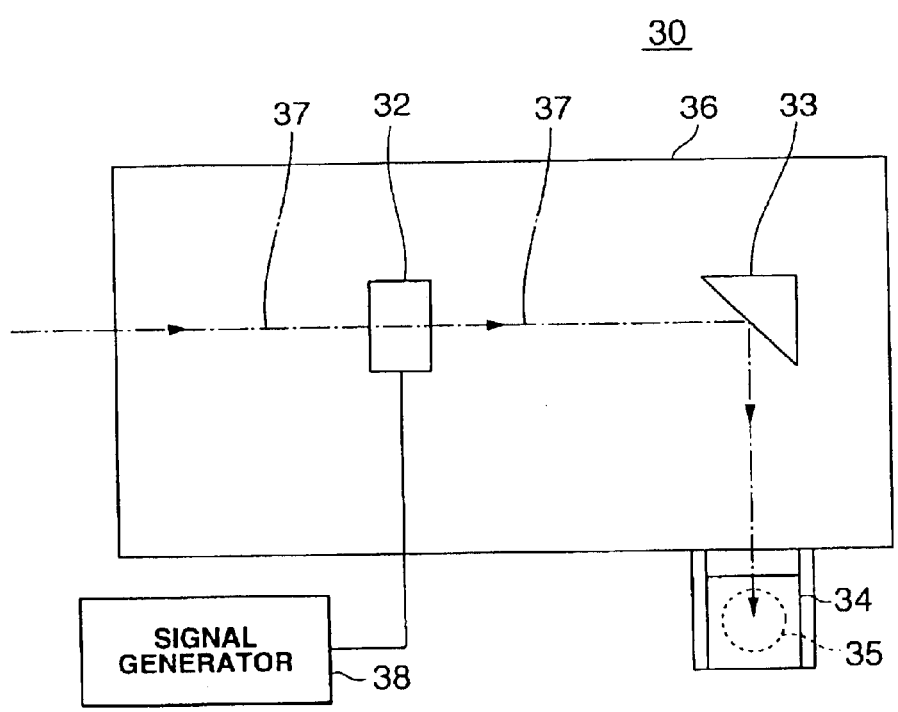
FIG. 4 is an explanatory diagram for explaining the function of the respective parts of the aligner.
Figure 5:
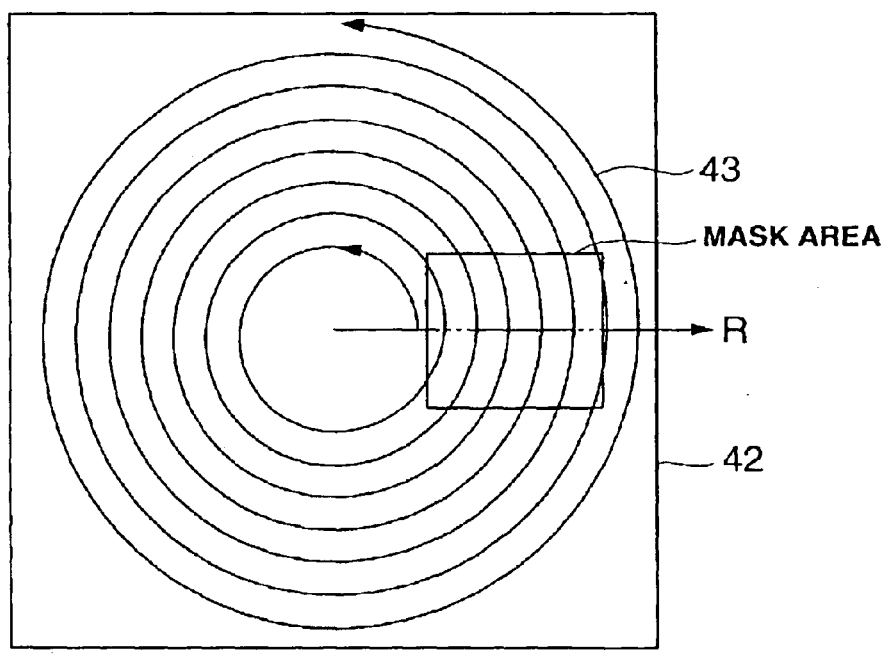
FIG. 5 is an explanatory diagram for explaining the trace of the exposure to the mask substrate.
Figure 6:
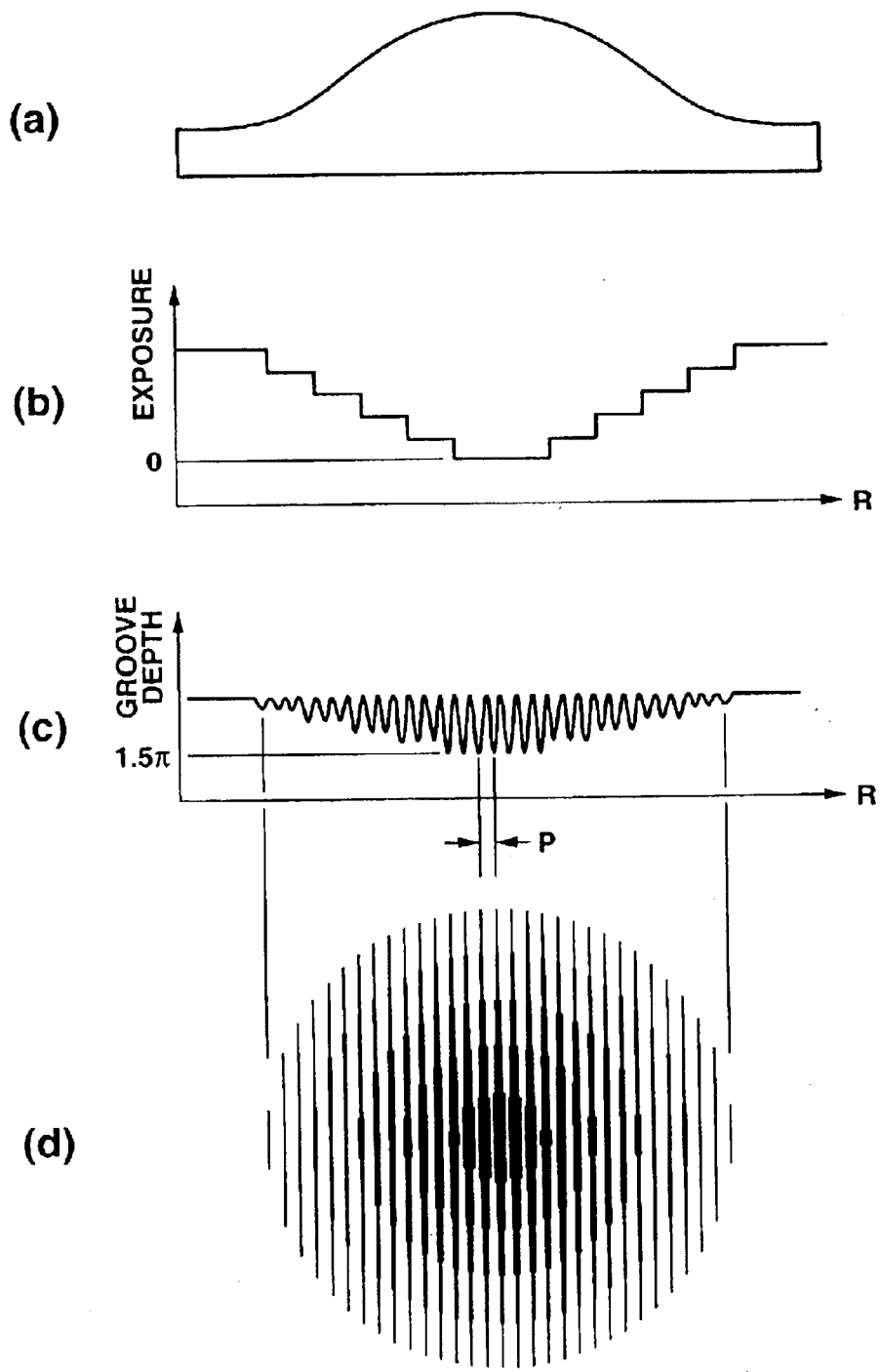
FIG. 6 is an explanatory diagram for explaining the manufacturing process of a phase grating photomask.

FIG. 3 is a diagram for explaining the aligner of a rotational scanning system to be used for preparing a photomask. FIG. 4 is a functional block diagram for explaining the optical modulation system of the exposed light. FIG. 5 is an explanatory diagram for explaining the trace of the exposure to the substrate with the aligner. FIG. 6 is an explanatory diagram for explaining the groove forming process with the aligner, wherein FIG. 6(*a*) is a diagram illustrating the target shape, FIG. 6(*b*) is a diagram for explaining the amount of exposed light to be controlled for obtaining the foregoing shape, FIG. 6(*c*) is a diagram for explaining the cross section of the groove group formed on the substrate of the photo resist film, and FIG. 6(*d*) is a plan view for explaining the grating pattern bearing the mask pattern information formed on the substrate of the photo resist.

As depicted in FIG. 3 and FIG. 4, the drawing aligner 30 is structured from the likes of a laser generating device 31 for emitting the laser 37 as the beam exposure light source, a signal generator (pattern generator) 38 for generating a level signal with a rotational coordinate system in accordance with the number of pixels of the mask groove pattern, an acousto-optical modulator (AOM) 32 for modulating the laser 37 in accordance with the level signal from the signal generator 38, a guidance optical system such as the reflecting mirrors 33, 34 for guiding the laser 37 that passed through this acousto-optical modulator 32 on the substrate 42 for exposure, an objective lens 35 for forming a spot 39 by converging the laser 37 on the substrate 42 for exposure, a turntable 41 for rotatably driving the substrate 42 for exposure, a movable optical bench 36 for mounting the acousto-optical modulator 32, reflecting mirrors 33 and 34, objective lens 35 among others and moving in the diameter direction of the turntable 41, a signal supplying device for supplying a pattern signal to the acousto-optical modulator 32, and a focus control device (not shown) for adjusting the focal position of the objective lens 35, among others. The movable optical bench 36 and turntable 41 are controlled with the signal generator 38, and the coordinate position of the read-out pixel and the position of the laser spot 39 on the substrate 42 for exposure are made to be in synchronization.

The laser generator 31, for example, is a krypton gas laser device having a wavelength of 351 nm. The numerical aperture of the objective lens 35 is 0.9, and the laser spot 39 having a diameter of 0.48 µm is formed on the mask substrate 42. The mask substrate 42 with photo resist applied thereto is mounted on the turntable 41, and rotates at a prescribed revolution. The movable optical bench 36 having mounted thereon the objective lens 35, in synchronization with this rotation, slowly moves in the radial direction of the turntable 41 at a speed of 0.6 µm for each rotation. Thereby, a spiral exposure as illustrated in FIG. 5 is performed on the mask substrate 42. As described above, the laser spot 39 is smaller than the track pitch of 0.6 µm of the exposure trace 43.

For example, when forming a phase grating mask (photomask) for obtaining a microlens in the mask forming area of the substrate 42 depicted in FIG. 5, a signal corresponding to the shape (height) of the drawing position is supplied from the signal generator 38 to the acousto-optical modulator 32 in correspondence with the profile (cross section shape) of the microlens shape as shown in FIG. 6(a), and the exposure of the laser 37 is controlled as illustrated in FIG. 6(b). The exposure may be controlled to be in further multisteps, or in further succession. As a result of performing development processing of the photo resist film of the substrate after exposure, a groove group having a 0.6 µm pitch (P) is formed as illustrated in FIG. 6(c) and FIG. 6(d). These grooves are of a spiral shape as shown in FIG. 5 when viewed in their entirety. Each of the grooves is mutually parallel, and each groove is of a depth according to the height of the respective parts of the microlens to be formed. As described above, the depth of the respective grooves is formed between 0 to 1.5π (for example, 0 to 570 nm in the case of i line) of the phase depth of the exposed light to be used in the aligner 60 described later. Thereafter, dry etching is performed with the photo resist film as the mask, and the phase grating of the photo resist film is transcribed on to the quartz substrate, whereby obtained is a phase grating mask.

Next, the outline of the pattern exposure employing the foregoing phase grating mask is explained with reference to FIG. 7.

Figure 7:
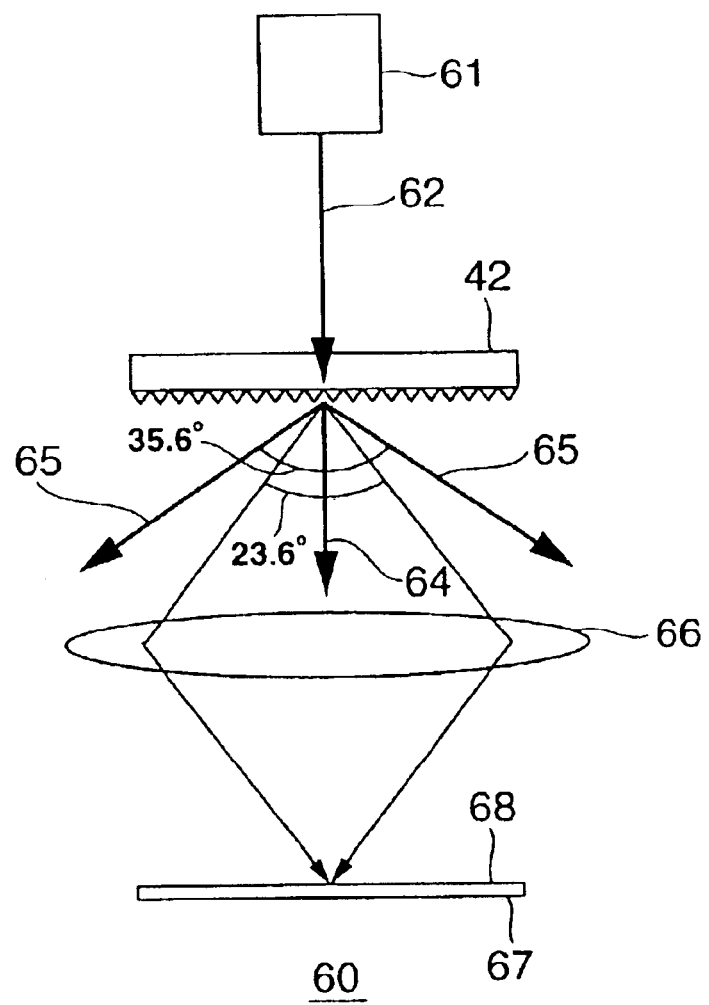
FIG. 7 is an explanatory diagram for explaining an example of an aligner for exposing the substrate with the phase grating photomask of the present invention.

As shown in FIG. 7, the pattern aligner 60 is structured with an exposure light source 61, a phase grating mask 42, a projection lens 66, and a light sensitive substrate 67 being disposed in suitable intervals. An infrared lamp of an i line having a wavelength (λ) of 365 nm is used for the exposure light source 61. The photomask 42 is the phase grating mask of the quartz substrate described above. The maximum depth of the groove of the mask 42 is 570 nm, which corresponds to the phase depth of 1.5π of the i line. Moreover, the groove pitch is 0.6 µm. The incident side numerical aperture NA of the projection lens 66 is set to 0.4, and the elevation angle of the entrance pupil is set to 23.6 degrees.

The minimum resolving power D of the aligner comprising an imaging system with the projection lens is represented with D=λ/NA. In this embodiment, the minimum resolving power D is 0.365/0.4=0.912 µm, and the pitch P (=0.6 µm) of the phase grating of the photomask satisfies P<D=λ/NA. Therefore, the groove pattern of the phase grating is not transcribed with the imaging system of the aligner, and only the luminous energy distribution of the 0 order light is transcribed on to the light sensitive substrate 67. A positive type photo resist 68 is applied to the material to be processed in order to obtain the light sensitive substrate 67.

When the photomask is irradiated with the exposure light 62, the transmitted light is separated into a 0 order light 64 and a ±first order light 65 with the phase grating. The 0 order light 64 advances straight forward, and the diffraction angle of the ±first order light 65 becomes 35.6 degrees. Since the elevation angle of the entrance pupil of the projection lens 66 is 23.6 degrees, the ±first order light 65 deviates outward from the projection lens 66, and only the 0 order light 64 enters the projection lens 66. Moreover, depending on the setting of the wavelength of the exposure light 62 and the groove interval (pitch) of the phase grating, higher order diffracted light such as second order light or higher may be generated. Nevertheless, since the higher order diffracted light has a larger diffraction angle than the first order light, it will not enter the projection lens 66.

Development processing is performed to the substrate 67 having been exposed to the pattern of the photomask 42 with the projection lens 66 for a prescribed amount of time. The portion with much exposure (shallow area of the groove of the mask 42) is developed deeply, and the portion with less exposure (deep portion of the groove of the mask 42) is developed shallow. For example, when the photomask is of a pattern as shown in FIG. 6(d), a semispherical microlens as shown in FIG. 6(a) is obtained on the substrate with the photo resist. As a result of employing this microlens, or by etching the substrate with the microlens of this resist as the mask and transcribing the microlens shape, a microstructure can be formed.

Figure 8:
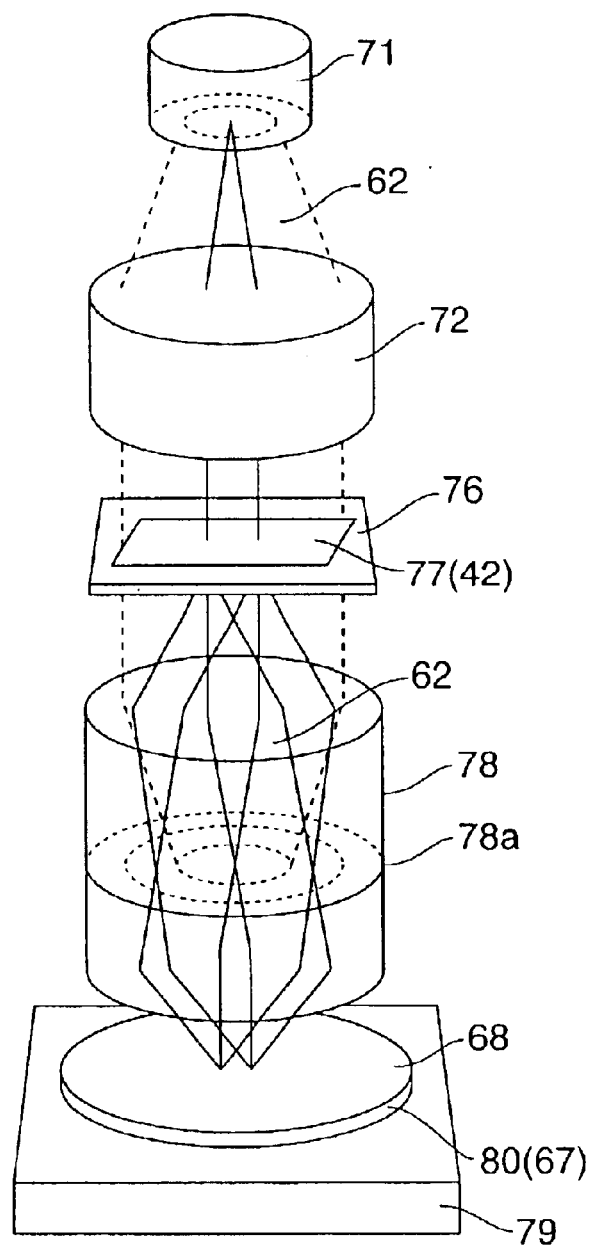
FIG. 8 is an explanatory diagram for explaining an example of a stepper device employing a phase grating photomask.

FIG. 8 is a schematic structural diagram for explaining an example of using a stepper as the foregoing pattern aligner 60. In FIG. 8, the stepper 70 has a light source 71 structured from the likes of a mercury lamp capable of emitting an i line 62 having a wavelength of λ. The exposure light 62 emitted from the light source 71 becomes a parallel light with the condenser lens 72, and irradiates the reticle 77 retained on the reticle bench 76 disposed below the condenser lens 72. The reticle 77 is structured with the foregoing phase grating mask 42. The reticle bench 76 is formed to be movable in the vertical direction with a moving mechanism not shown. Further, a reduction projection lens 78 is provided below the reticle bench 76. This reduction projection lens 78 corresponds to the foregoing projection lens 66, and reduces and projects only the 0 order light generated with the phase grating mask on to a semiconductor substrate 80 (corresponds to the substrate 67) disposed on the upper face of a worktable 79 capable of planar movement. The reduced projection is capable of projecting on the substrate a pattern formed on the reticle 77, for example, upon reducing it to ⅕ or ⅒ of the original size.

In this type of aligner 70, if the aperture of a pupil face 78a of the projection lens 78 is set to NA, and the wavelength of the exposure light is set to λ, the resolution (minimum resolving power) D will be represented with λ/NA. If the pitch P of the phase grating is made narrower than the resolution D, a semispherical exposure pattern (latent image) recorded on the depth or width of the groove, or on the depth and width of the groove of the phase grating is formed on the photo resist 68 of the substrate 80 with exposure of only the 0 order light.

The stepper 70 formed as described above forms the exposure pattern of the microlens array upon repeating the microlens pattern formed with the phase grating mask 42, for example, with the step-and-shot method to the photo resist 68 applied to the semiconductor substrate 80.

(Second Embodiment)

Next, the second embodiment of the present invention is explained. In the foregoing first embodiment, a single beam was used to form a groove having a sinusoidal cross section in the resist upon forming a groove of the phase grating, and the intensity of the beam was changed to set the depth of this groove. In the second embodiment, the depth of the groove is relatively set by changing the height of the land around the groove of the phase grating. Specifically, an intensity-modulated beam is exposed on the mutual land of the groove having a deep fixed track pitch formed on the resist to change the height of the land, and the depth (from the land of) the deep groove is set thereby.

EXAMPLE 1

Thus, in Example 1 of the second embodiment, forwarding of the slider is made to a half pitch, the first scanning beam exposure is used to form the deep groove (or land), and the second beam is used to form the land (or deep groove). In other words, upon forming a single groove of a phase grating, the resist groove corresponding to the foregoing groove is formed with the scanning of two (a plurality of) beams. The aligner illustrated in foregoing FIG. 3 and FIG. 4 may be employed in this method.

That is, as shown in both diagrams, the beam emitted from the laser generator 31 is condensed on the substrate via the acousto-optical modulator 32, reflecting mirrors 33 and 34, and object lens 35. As described above, the diameter of the laser beam spot 39 (first dark ring of an airy disk) is 0.48 $\mu$m, and is smaller than the groove pitch of 0.6 $\mu$m but larger than ½ the groove pitch. A photo resist 44 is applied on the surface of this mask substrate 42 to a thickness of approximately 800 nm with the spin coating method. This substrate 42 is mounted on the turntable 41 and rotated at a fixed revolution.

In this Example, while rotating the turntable 41 at a prescribed revolution, by simultaneously moving the movable optical bench 36 having mounted thereon the objective lens 35 at 0.3 $\mu$m, which is half the speed of the first embodiment, per rotation in the radial direction, the resist 44 is exposed in a spiral shape with the beam spot 39. In other words, optical beam exposure scanning is performed with the track pitch at ½ and twice the number of tracks of the first embodiment. Therefore, one groove of the grating in the first embodiment is formed with the scanning of two beams (two grooves per pitch).

Figure 9:
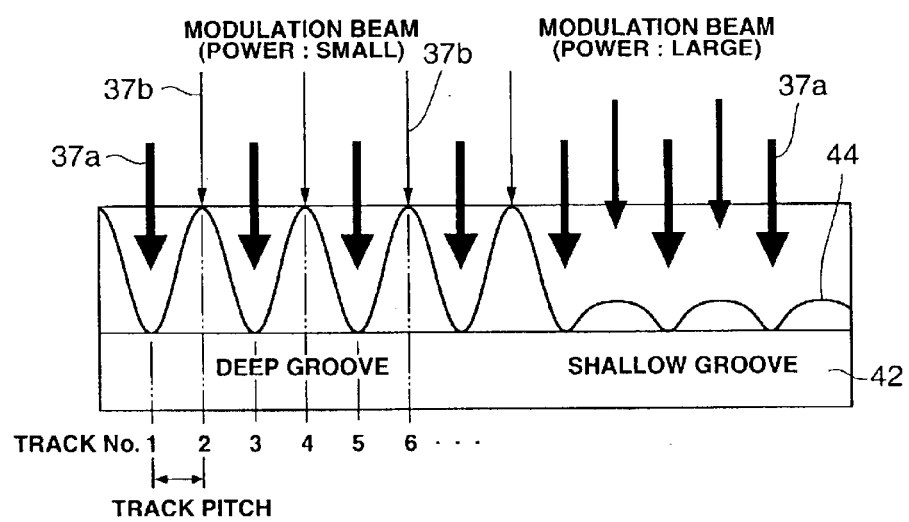
FIG. 9 is an explanatory diagram for explaining an example for setting the groove depth by changing the height of the land between grooves.

Here, as shown in FIG. 9, the first beam scanning (for example, odd-numbered track scanning) of the two tracks within a single grating pitch is referred to as a bias beam 37a, and the second beam scanning (for example, even-numbered track scanning) is referred to as a modulated beam 37b. Exposure with the bias beam 37a and exposure with the modulated beam 37b are performed alternately per rotation. For instance, the groove formed with the bias beam 37a is exposed at a specific amount of energy density. When the luminous energy of the modulated beam 37b of the adjacent track is 0, the groove will be of a maximum depth, and the exposure of the bias beam 37a is determined such that the 0 order transmittance will become minimum. The luminous energy of the modulated beam 37b is modulated with a signal according to the drawing pattern between 0 and the luminous energy of the bias beam 37a. This signal is previously stored in the signal generator 38. When the luminous energy of the modulated beam 37b is 0, as described above, the groove will be of a maximum depth, and the 0 order optical transmittance will become minimum. When the luminous energy of the modulated beam 37b is maximum; that is, when it is equivalent to the luminous energy of the bias beam 37b, a groove will not be formed. The reason being, since the beam diameter is larger than the track pitch (=½ of groove pitch), the optical resolving power will be insufficient, and this will be equivalent to an even exposure across approximately the entire surface. Here, the 0 order optical transmittance will be maximum (c.f. FIG. 2).

Pattern exposure is performed to the resist 44 by exposing the groove portion and land portion with this kind of double density scanning, a spiral groove having a pitch of 0.6 $\mu$m is formed by performing development processing after the exposure, and a phase grating mask patterned such that the 0 order optical transmittance will correspond to the groove depth is prepared thereby. The photomask of the present invention is then completed by performing anisotropic dry etching with this as the mask, and transcribing the phase grating pattern on to the quartz substrate 42.

Figure 10:
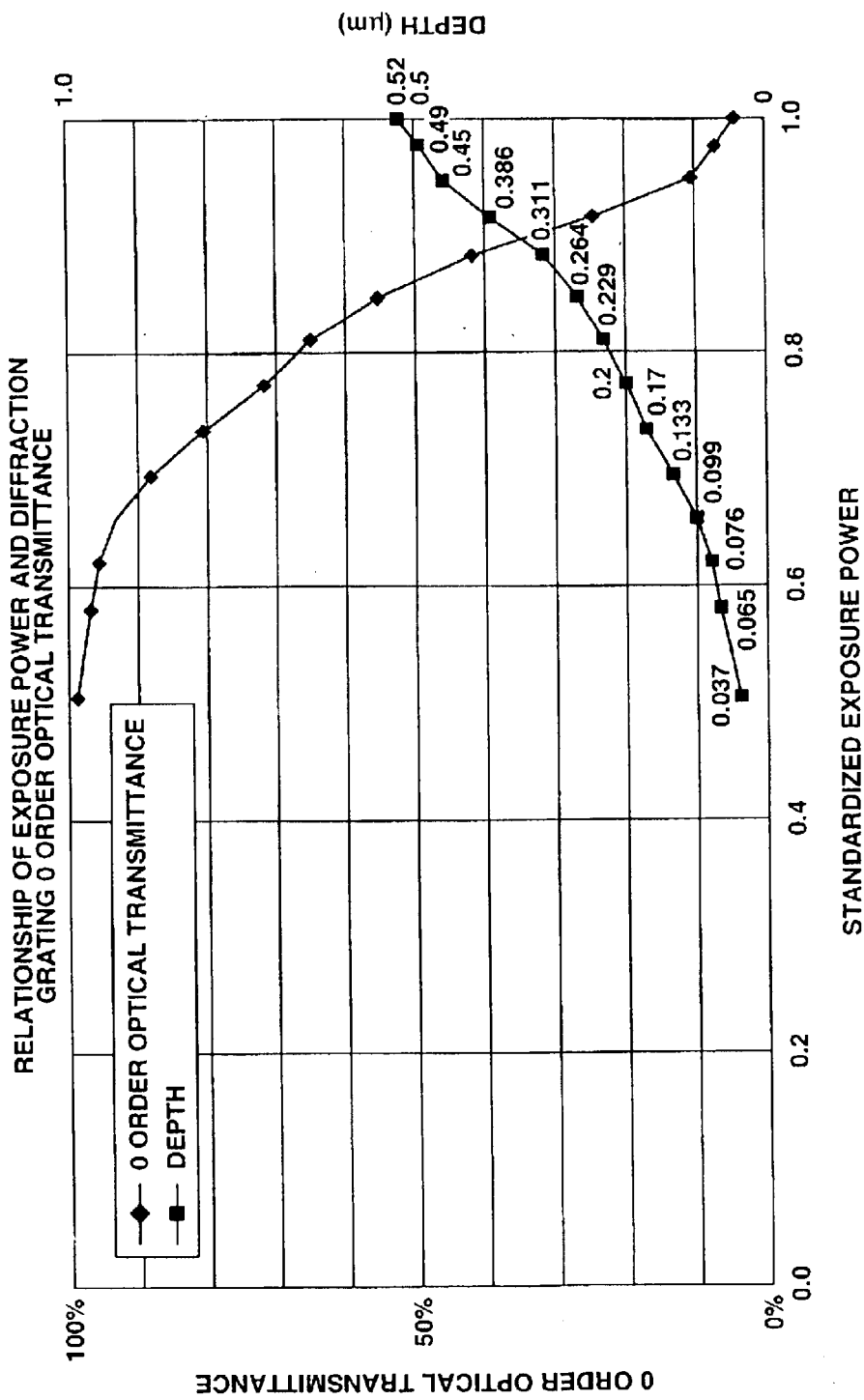
FIG. 10 is a graph for explaining the relationship of the exposure power (groove depth) and the 0 order optical transmittance of a sinusoidal groove phase grating.
Figure 11:
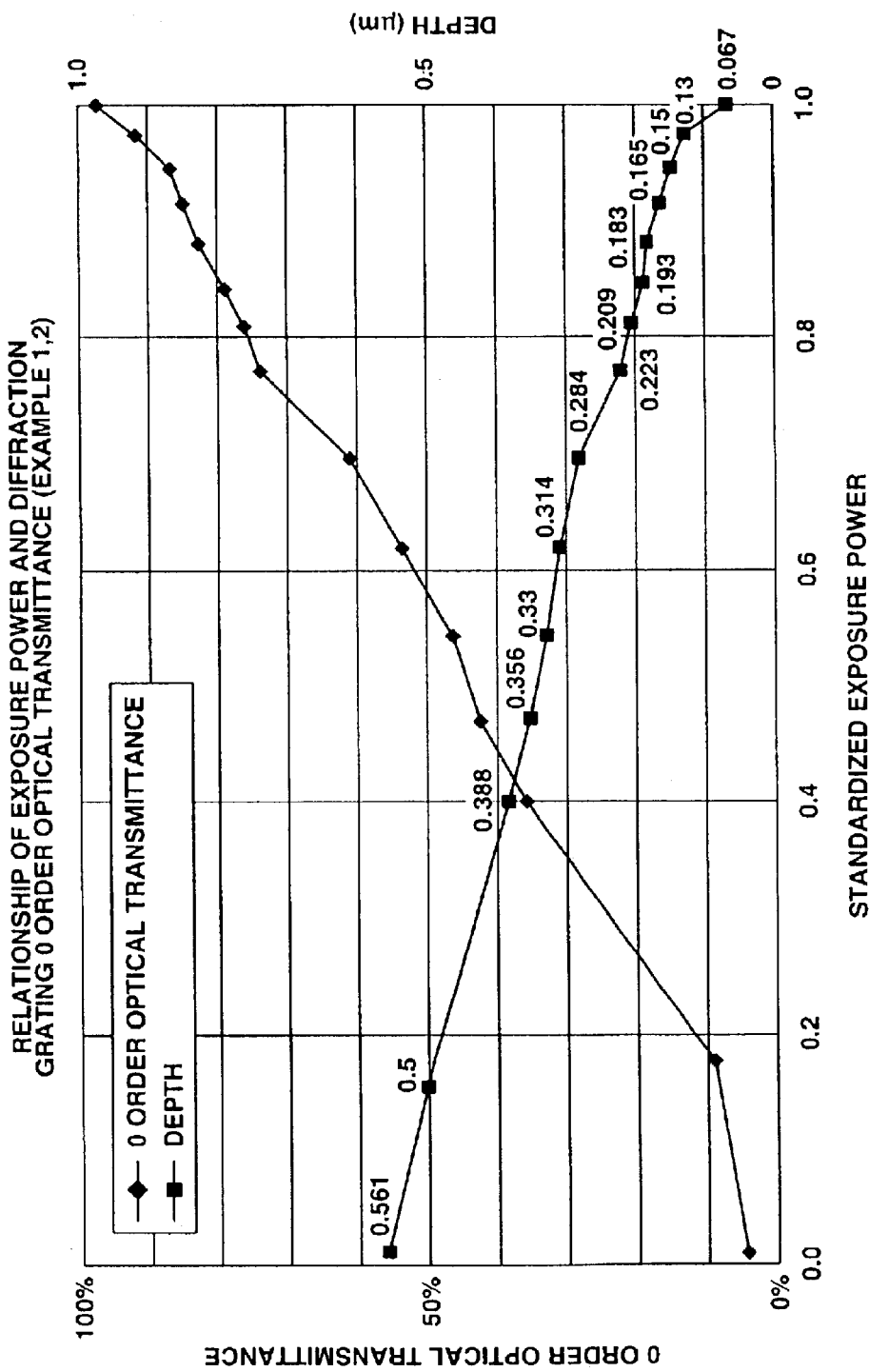
FIG. 11 is a graph for explaining the relationship of the exposure power (groove depth) of the phase grating to which a groove is formed with the land height and the 0 order optical transmittance.

FIG. 11 is a graph showing an example of the phase grating characteristic (groove/land exposure) of the foregoing Example to which a groove and land have been patterned. Moreover, FIG. 10 is a graph showing a comparative reference example (single beam exposure) of the phase grating mask to which only a groove has been patterned. In both graphs, the vertical axis on the left side shows the 0 order optical transmittance of the phase grating mask, and the vertical axis on the right side shows the depth of the groove. The horizontal axis shows the exposure beam power upon preparing the phase grating. The exposure power is standardized to be a value of 1 where the 0 order optical transmittance is 100%.

With the single beam exposure method, both the 0 order optical transmittance characteristic shown in the black circle point group graph and the depth characteristic shown in the black square point group graph are able to obtain a tone within the exposure range of 0.6 to 1.0 among the entire exposure power, and the falling edge and rising edge of the curve are sharp. Contrarily, the groove/land exposure method of the Example shows an inclination characteristic in the opposite direction to that of the single beam exposure method. And, tone is obtained in a wide exposure power range where the modulation exposure power is 0 to 1.0, and the falling edge of the 0 order optical transmittance characteristic curve and the rising edge of the depth characteristic curve are both gradual, and show favorable linearity.

EXAMPLE 2

Figure 12:
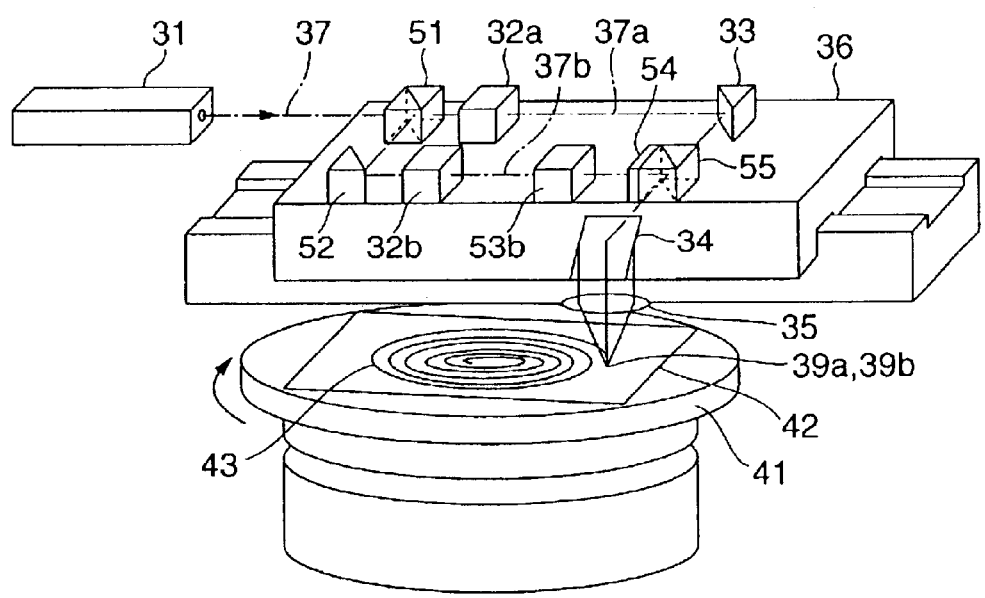
FIG. 12 is an explanatory diagram for explaining an example of an aligner that simultaneously forms the groove and land with two beams.
Figure 13:
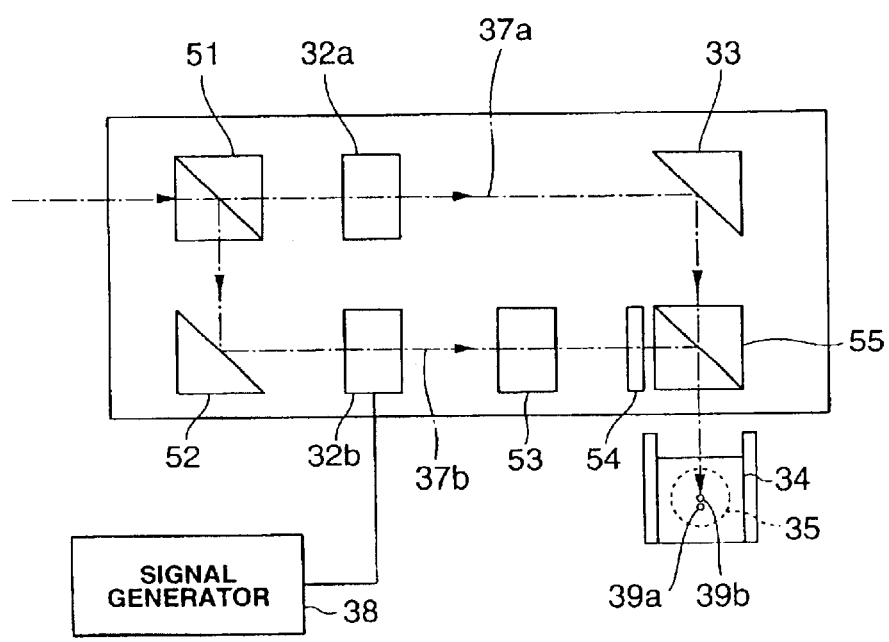
FIG. 13 is an explanatory diagram for explaining the function of the respective parts of the aligner employing two beams.
Figure 14:
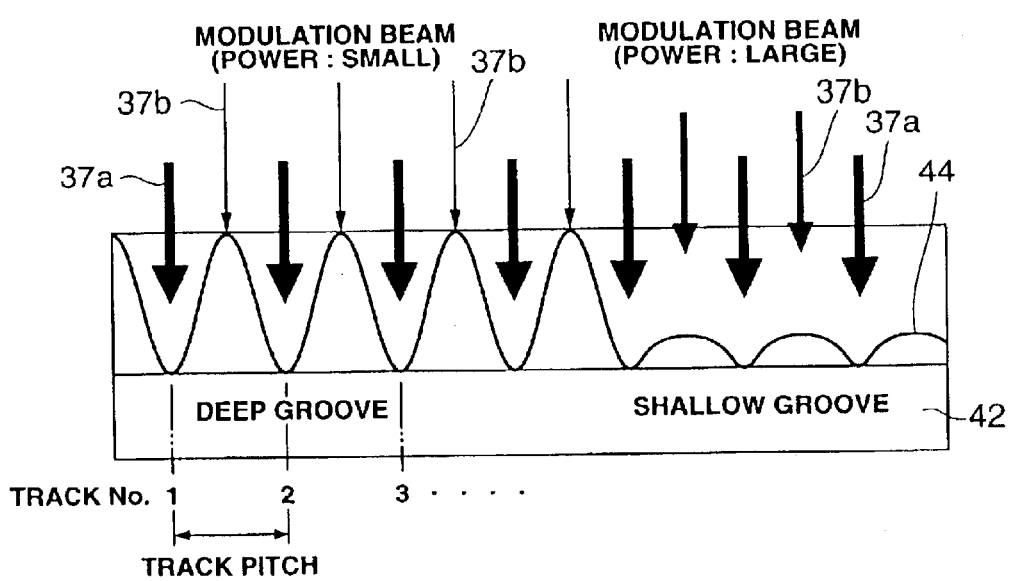
FIG. 14 is an explanatory diagram for explaining the simultaneous formation of the groove and land with two beams.

FIGS. 12 to 14 illustrate Example 2 of the second embodiment. In these diagrams, the portions corresponding to FIG. 3, FIG. 4 and FIG. 9 are given the same reference numerals, and the explanation thereof is omitted.

In this Example, the groove and land are simultaneously exposed and formed by simultaneously irradiating a plurality of beams (two in this Example) on the resist of the substrate.

As depicted in FIG. 12 and FIG. 13, the laser beam 37 emitted from the laser generator 31 is divided into two beams with the splitter 51 formed of a half mirror. The first laser beam becomes a bias beam 37a upon passing through the acousto-optical modulator 32a to which a bias signal is applied, arrives on the substrate 42 upon passing through the reflecting mirror 33, half mirror 55, reflecting (incident) mirror 34 and objective lens 35, and thereby becomes a bias beam spot 39a. The second laser beam becomes a modulated beam 37a upon passing through the reflecting mirror 52, and the acousto-optical modulator 32b to which a modulated signal corresponding to the exposure pattern is applied from the signal generator 38, arrives on the substrate 42 upon passing through the acousto-optical deflector (AOD) 53, ½ wavelength plate 54, half mirror 55, reflecting mirror 34, and objective lens 35, and thereby becomes a modulated beam spot 39b. Here, the acousto-optical deflector 53 is used for setting the mutual distance between the beam spot 39a and the beam spot 39b. Moreover, the ½ wavelength plate 54 rotates the plane of polarization of the beam 37b 90 degrees against the plane of polarization of the beam 37a such that the two laser beams 37a, and 37b do not interfere with each other.

As shown in FIG. 14, the distance between the two beams 37a and 37b is adjusted to 0.3 μm with the acousto-optical deflector 53. As a result of the movable optical bench 36 moving slowly in the radial direction at a speed of 0.6 μm (track pitch) per rotation of the turntable 41, exposure for two rotations worth of the turntable in Example 1 can be conducted with a single rotation. One of the two beams, for example, the beam 37a is made to be a fixed luminous energy with the acousto-optical modulator 32a, and, with this as the bias beam 37a, the resist 44 is exposed with a fixed amount of energy density. Thereby, a deep groove may be formed in the resist 44. The other remaining beam 37b is level modulated in correspondence with the exposure pattern with the acousto-optical modulator 32b, and, with this as the modulated beam 37b, the resist 44 is exposed to record the pattern. It is thereby possible to form a land portion in which the height thereof changes.

Pattern exposure is performed to the resist 44 by exposing the groove portion and land portion with this kind of simultaneous two beam (plurality beam) scanning, a spiral groove having a pitch of 0.6 μm is formed by performing development processing after the exposure, and a phase grating mask patterned such that the 0 order optical transmittance will correspond to the groove depth is prepared thereby. The photomask of the present invention is then completed by performing anisotropic dry etching with this as the mask, and transcribing the phase grating pattern on to the quartz substrate 42.

(Third Embodiment)

In the present embodiment, two laser beams are obliquely irradiated from a slider moving on two adjacent tracks toward the middle of the two tracks so as to expose the photo resist, and the depth and width of the groove of the resist formed between the two tracks are set with the superposition adjustment of the two tilted beams.

EXAMPLE 1

Figure 15:
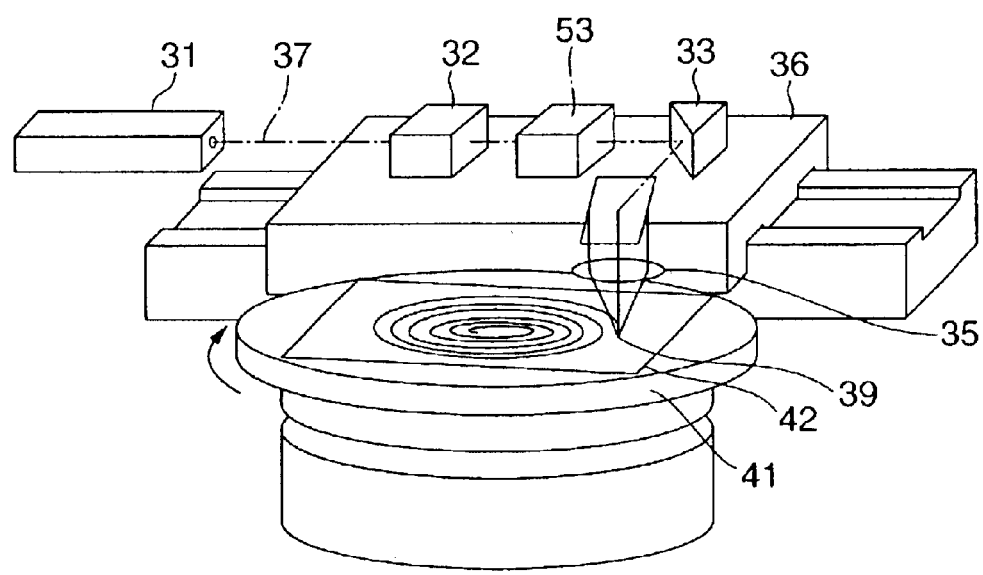
FIG. 15 is an explanatory diagram for explaining an example of an aligner capable of changing the irradiation angle of the exposure beam.
Figure 16:
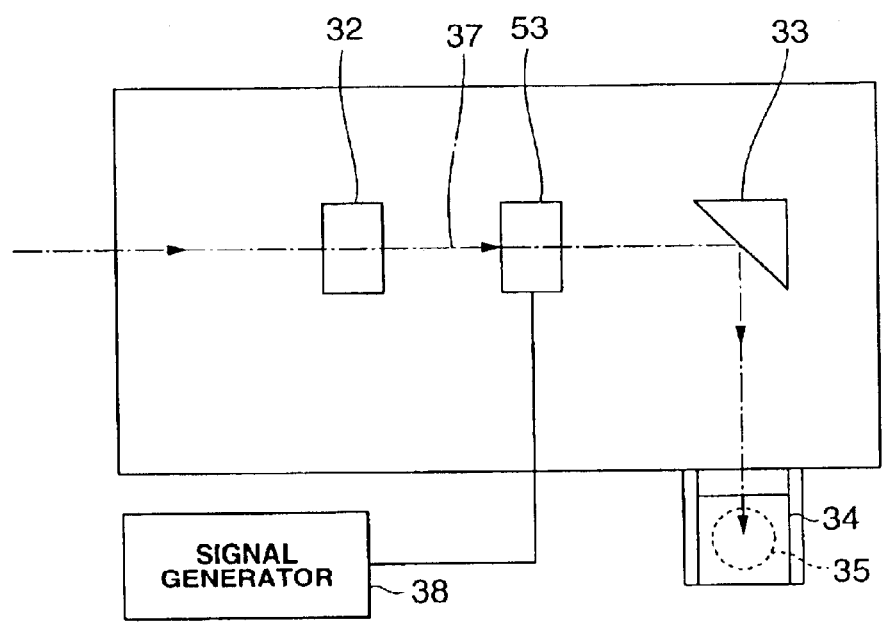
FIG. 16 is an explanatory diagram for explaining the function of the respective parts of the aligner capable of changing the irradiation angle of the exposure beam.
Figure 17:
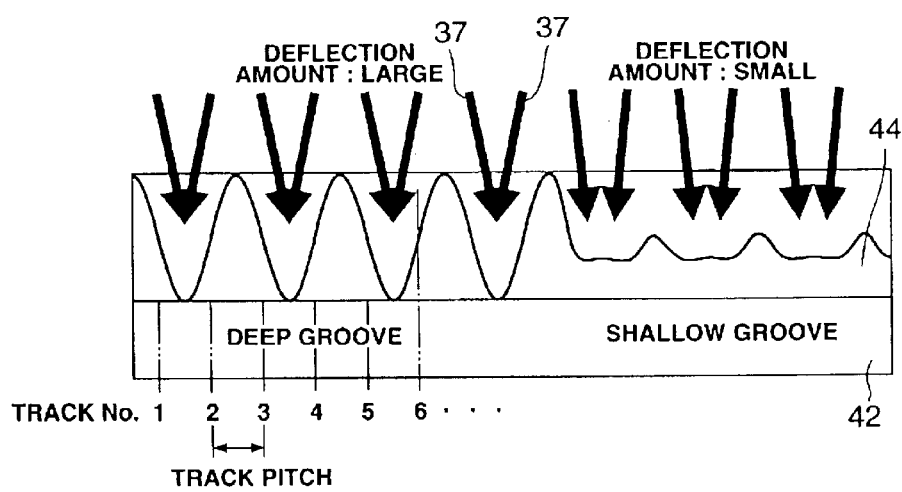
FIG. 17 is an explanatory diagram for explaining an example of forming a groove by deflecting the exposure beams in and out and overlaying such beams.

FIG. 15, FIG. 16 and FIG. 17 illustrate Example 1 of the third embodiment. In these diagrams, the portions corresponding to FIG. 3, FIG. 4 and FIG. 9 are given the same reference numerals, and the explanation thereof is omitted.

In Example 1, two tilted beams are obtained by switching the direction of one laser beam scanning in a spiral alternately in and out of the diameter direction per track (or per rotation).

As illustrated in FIG. 15 and FIG. 16, the laser beam 37 emitted from the laser generator 31, after a bias signal is applied thereto, arrives on the substrate 42 upon passing through the acousto-optical modulator 32 for setting the direct current level of the laser beam 37, acousto-optical deflector 53 to which is supplied a deflection signal, reflecting mirror 33, incident mirror 34 and objective lens 35, and thereby forms a beams spot 39. The signal generator 38 previously stores the deflection data corresponding to the exposure pattern in a polar coordinate format, and supplies the deflection signal to the acousto-optical deflector 53 in correspondence with the scanning position on the track. Deflection data contains data of odd-numbered tracks and data of even-numbered tracks. For example, when scanning the exposure beam spirally while moving the movable optical bench 36 from the center of the turntable 41 toward the outer periphery side thereof, data (pixel data) of the exposure pattern of the odd-numbered tracks contains information for deflecting in a prescribed amount the laser beam 37 positioned above the foregoing track position toward the outside of the diameter direction of the turntable 41. Moreover, pattern data of the even-numbered tracks contains information for deflecting in a prescribe amount the laser beam 37 positioned on the foregoing track position toward the inside of the diameter direction of the turntable 41. The amount of deflection of each data is set between 0 and half pitch.

In the foregoing structure, as depicted in FIG. 17, the movable optical bench 36 moves slowly in the radial direction at a speed of 0.3 μm (track pitch) per rotation of the turntable 41 from the center of the turntable 41 toward the outside thereof. Since the single groove formed with exposure is formed with two exposures; namely, the beam exposure from above the odd-numbered tracks, and the beam exposure from above the even-numbered tracks, the groove pitch thereof is 0.6 μm.

Pursuant to the acousto-optical deflector 53, the beam 37 is deflected toward the outside direction during the exposure of odd-numbered tracks, deflected toward the inside direction during the exposure of even-numbered tracks, and deflected between the distance of 0 to half the track pitch (0.15 μm) with a signal according to the drawing pattern.

When the amount of deflection is 0, the beam 37 exposes the respective tracks as a pitch of 0.3 μm, which results in the exposure of the entire surface, and the 0 order optical transmittance of the prepared phase grating will become maximum. When the amount of deflection of the beam 37 is maximum (0.15 μm), exposure of odd-numbered tracks and exposure of even-numbered tracks will overlap, and a phase grating having a maximum pitch depth of 0.6 μm is prepared. Here, the luminous energy of the beam is adjusted such that the 0 order diffraction efficiency will become minimum (approximately 0).

Pattern exposure is performed to the resist 44 pursuant to beam exposure with beam scanning in which the inclination has been modulated, a spiral groove having a pitch of 0.6 μm is formed by performing development processing after the exposure, and a phase grating mask patterned such that the 0 order optical transmittance will correspond to the groove depth is prepared thereby. The photomask of the present invention is then completed by performing anisotropic dry etching with this as the mask, and transcribing the phase grating pattern on to the quartz substrate 42.

As described above, a phase grating groove having a width and depth in accordance with the amount of deflection of the laser beam 37 corresponding to the mask pattern is prepared, the 0 order optical transmittance of the phase grating will become a value according to the amount of deflection (mask pattern), whereby a halftone is represented.

EXAMPLE 2

Figure 18:
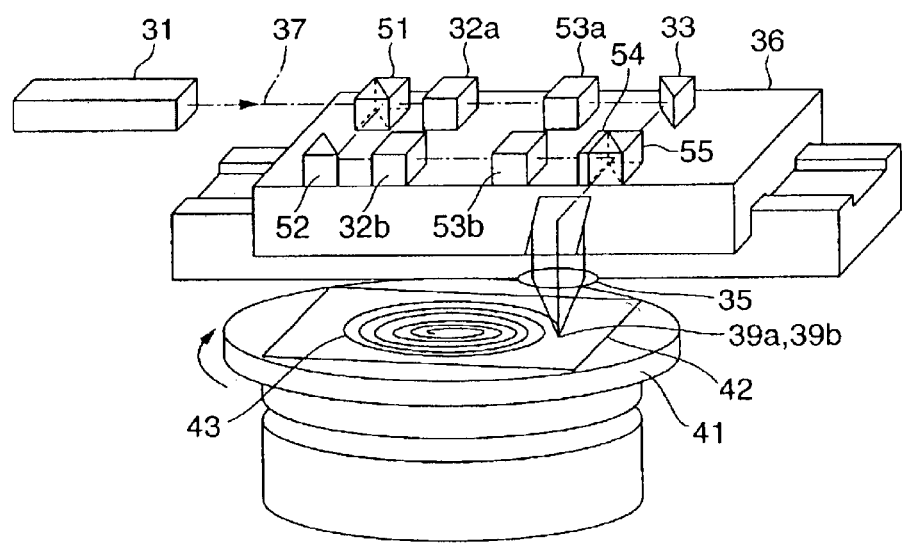
FIG. 18 is an explanatory diagram for explaining an example of an aligner that forms a groove by deflecting two exposure beams and simultaneously overlaying such beams.
Figure 19:
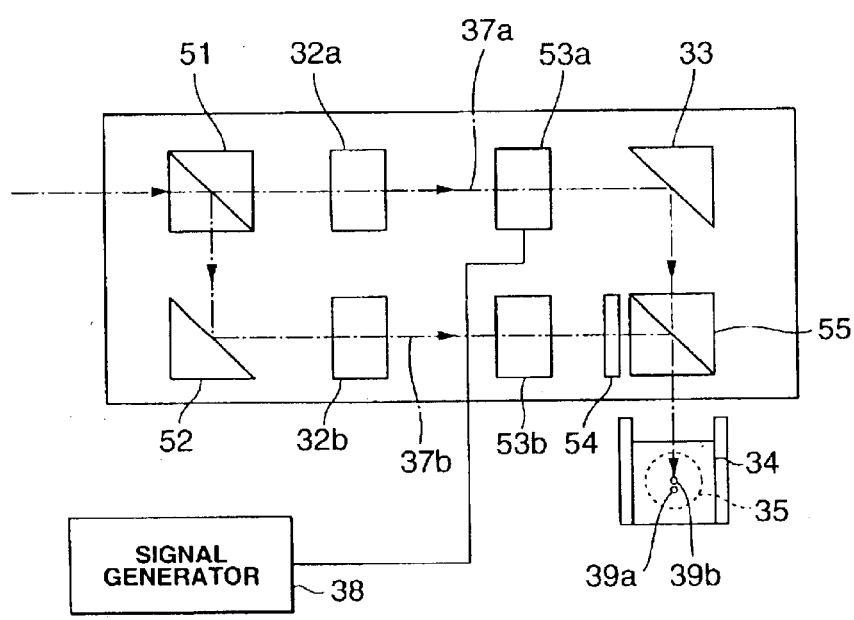
FIG. 19 is an explanatory diagram for explaining the function of the respective parts of the aligner that deflects two beams.
Figure 20:
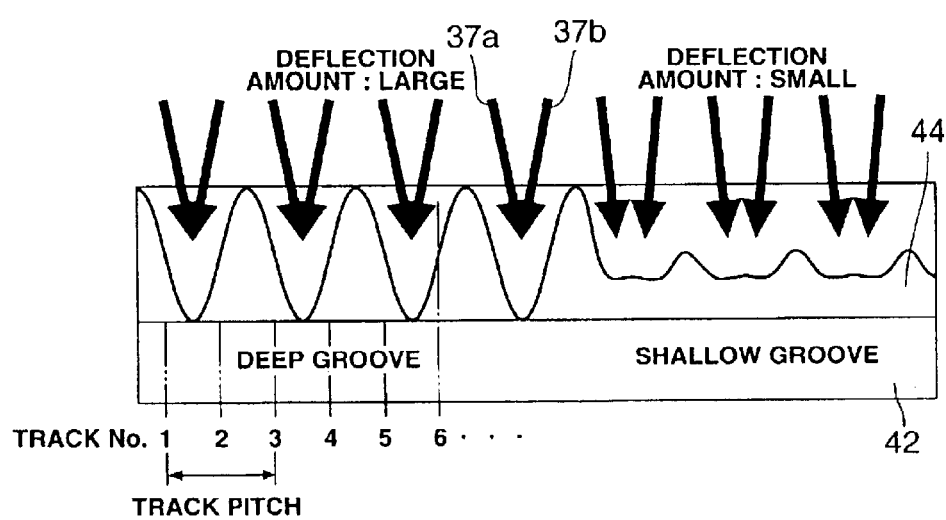
FIG. 20 is an explanatory diagram for explaining an example of forming a groove by deflecting two exposure beams and simultaneously overlaying such beams.

FIG. 18, FIG. 19 and FIG. 20 illustrate Example 2 of the third embodiment. In FIGS. 18 to 20, portions corresponding to FIGS. 15 to 17, respectively, are given the same reference numerals, and the explanation thereof is omitted.

In this Example, exposure is performed to the photo resist by simultaneously superposing two beams in which the inclination thereof has been changed, and the depth and width of the groove of the resist formed between the two tracks are set with the superposition adjustment of the two beams.

As depicted in FIG. 18 and FIG. 19, the laser beam 37 emitted from the laser generator 31 is divided into two beams 37a and 37b with the splitter 51 formed of a half mirror. The laser beam 37a arrives on the substrate 42 upon passing through the acousto-optical modulator 32a to which a level setting signal is applied, acousto-optical deflector 53a, reflecting mirror 33, half mirror 55, reflecting (incident) mirror 34 and objective lens 35, and thereby becomes a bias beam spot 39a. The laser beam 37b arrives on the substrate 42 upon passing through the reflecting mirror 52, acousto-optical modulator 32b to which a level setting signal is applied, optical-optical deflector 53b, ½ wavelength plate 54, half mirror 55, reflecting mirror 34, and objective lens 35, and thereby becomes a beam spot 39b. The ½ wavelength plate 54 rotates the plane of polarization of the beam 37b 90 degrees against the plane of polarization of the beam 37a such that the two laser beams 37a, and 37b do not interfere with each other.

A modulated signal corresponding to the exposure pattern is applied to the acousto-optical deflectors 53a and 53b from the signal generator 38. The signal generator 38 previously stores the deflection data corresponding to the exposure pattern in a polar coordinate format, and supplies the deflection signal to the acousto-optical deflectors 53a and 53b in correspondence with the scanning position on the track. The acousto-optical deflectors 53a and 53b operate so as to symmetrically deflect the laser beams 37a and 37b. In other words, the acousto-optical deflector 53a deflects the optical axis of the laser beam 37a in accordance with the modulated signal, and changes the irradiation (inclination) angle of the irradiated beam on the track outward in the diameter direction of the substrate 42 between the distance of 0 and half the track pitch (0.15 µm). The acousto-optical deflector 53b deflects the optical axis of the laser beam 37b in accordance with the foregoing modulated signal, and changes the irradiation angle of the irradiated beam on the track outward in the diameter direction of the substrate 42 between the distance of 0 and half the track pitch.

When the amount of deflection of the laser beams 37a and 37b is 0, the laser beams 37a and 37b expose the respective tracks as a pitch of 0.3 µm, which results in the exposure of the entire surface, and the 0 order optical transmittance of the prepared phase grating will become maximum. When the amount of deflection of the beams 37a and 37b is maximum (0.15 µm), exposure of odd-numbered tracks and exposure of even-numbered tracks will overlap, and a phase grating having a maximum pitch depth of 0.6 µm is prepared. Here, the luminous energy of the beam is previously adjusted with the optical-optical modulators 32a and 32b such that the 0 order diffraction efficiency will become minimum (approximately 0).

According to the foregoing structure, the movable optical bench 36 moves slowly in the radial direction at a speed of 0.6 µm per rotation from the inside to the outside. The acousto-optical deflectors 53a and 53b are driven with a signal according to the drawing pattern, the distance between the two beam spots is modulated, and the width and depth of the prepared groove is modulated. When the amount of deflection of the laser beams 37a and 37b for irradiating the photo resist 44 is large, a deep groove is formed in the resist 44, and, when the amount of deflection is small, a narrow and wide groove is formed.

Pattern exposure is performed to the resist 44, a spiral groove having a pitch of 0.6 µm is formed by performing development processing after the exposure, and a phase grating mask patterned such that the 0 order optical transmittance will correspond to the groove depth is prepared thereby. The photomask of the present invention is then completed by performing anisotropic dry etching with this as the mask, and transcribing the phase grating pattern on to the quartz substrate 42.

Moreover, in this Example, although the interval of the initial spot is set to 0, the amount of deflection of the beams 37a and 37b with the optical-optical deflectors 53a and 53b is respectively set outside and inside between 0 and 0.15 µm, the initial spot interval of the two beams, deflection driving direction and amount of deflection of the optical-optical deflector may be combined variously.

With the method of each Example 1 in the first and second embodiments described above, uniformity of the luminous energy upon performing exposure on the entire surface will be favorable since a single laser beam is used, and a high-quality phase grating can be obtained thereby.

Further, with the method of each Example 2 in the first and second embodiments, the pattern exposure time will be half since two (a plurality of) laser beams are used simultaneously for the exposure, and a phase grating can be prepared inexpensively thereby.

Figure 21:
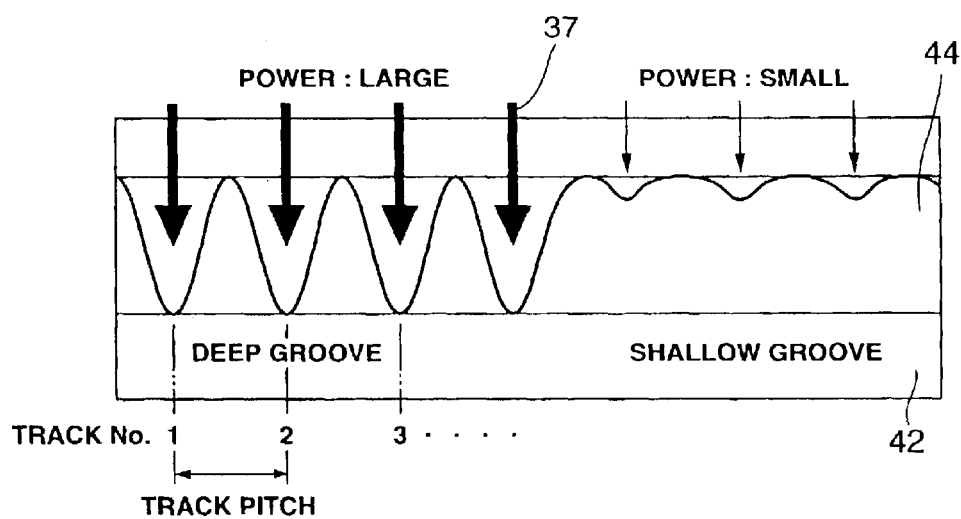
FIG. 21 is an explanatory diagram for explaining a comparative example in which a shallow groove is formed in the thick film of the photo resist.

In addition, in the respective Examples, as illustrated in FIG. 9, FIG. 14, FIG. 17 and FIG. 20, there is an advantage in that the residual photo resist after the development thereof is minimal. As depicted in the reference example of FIG. 21, when there is much residual photo resist after the development thereof, in particular, when there is much residual photo resist in the portion of the shallow grooves as in the reference example, the photo resist deforms easily due to the heat during the etching process, and there is a tendency of the resolution deteriorating, and it is favorable in that this kind of problem can also be overcome.

In order to improve the mask resolution as described above, it is necessary to narrow the track pitch. Nevertheless, when the track pitch is narrowed and approaches the optical resolving power, the cross section of the exposure pattern approaches a sinusoidal wave. In this kind of area, the threshold is vague as a pattern for the conventional binary mask, and cannot be used. The photomask of the Examples, however, is able to actively use the groove having a sinusoidal cross section in this narrow track pitch, and it is possible to narrow the track pitch in comparison to conventional methods, and a high resolution mask can be obtained thereby.

In addition, with a conventional binary mask, the positional precision and resolving power of the dots affected the resolution of the photomask, and this will not occur with the photomask of the examples.

Moreover, with the photomask of the Examples, the change in the 0 order transmittance against the exposure can be obtained sufficiently in linear tone steps, and a photomask favorable in controllability of the tone can be obtained thereby. Further, the residual resist after the development thereof is minimal, and a photomask that will not deform easily with the heat during the etching process and with minimal deterioration in resolution can be obtained thereby.

(Fourth Embodiment)

Next, the fourth embodiment of the present invention is explained. The cross section shape of the phase grating groove was sinusoidal in the foregoing first embodiment, but the cross section shape of the groove is of a trapezoid shape in the fourth embodiment.

Figure 22:
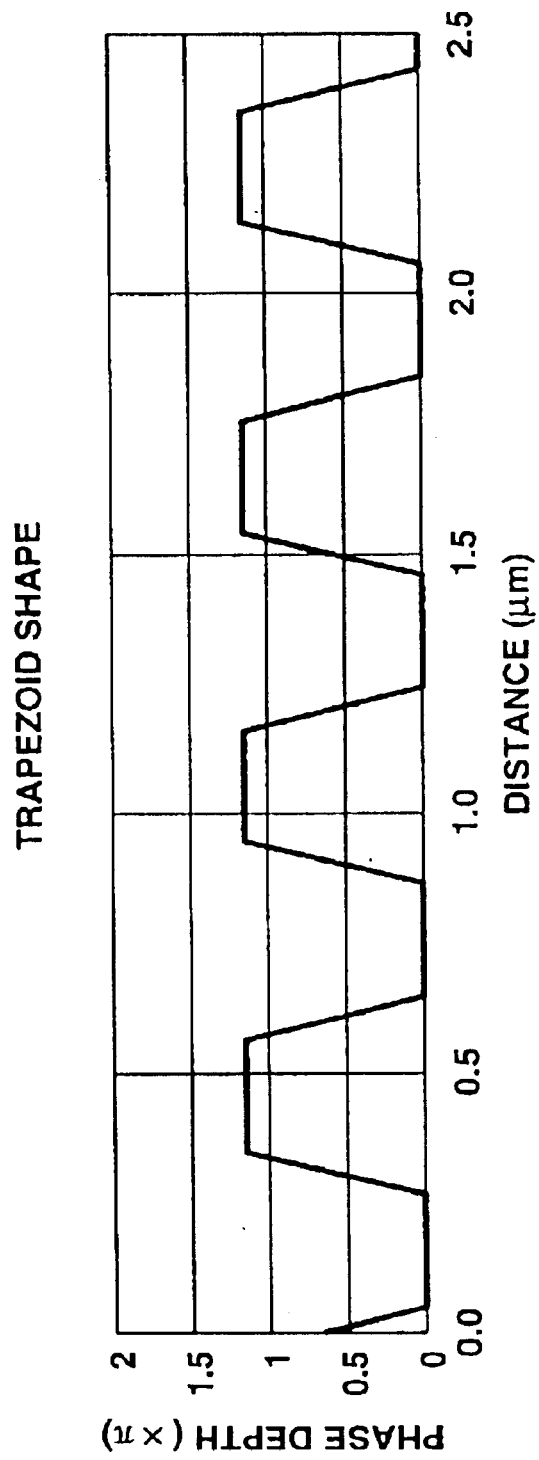
FIG. 22 is an explanatory diagram for explaining an example of a simulated trapezoid groove.
Figure 23:
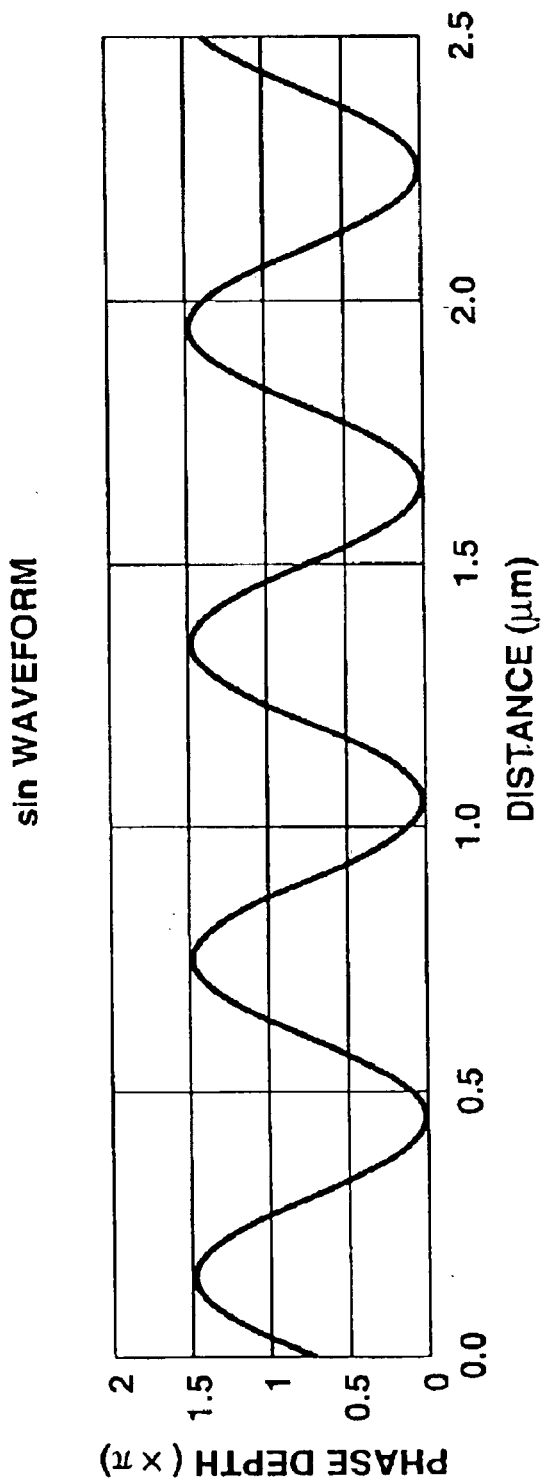
FIG. 23 is an explanatory diagram for explaining an example of a simulated sinusoidal groove.
Figure 24:
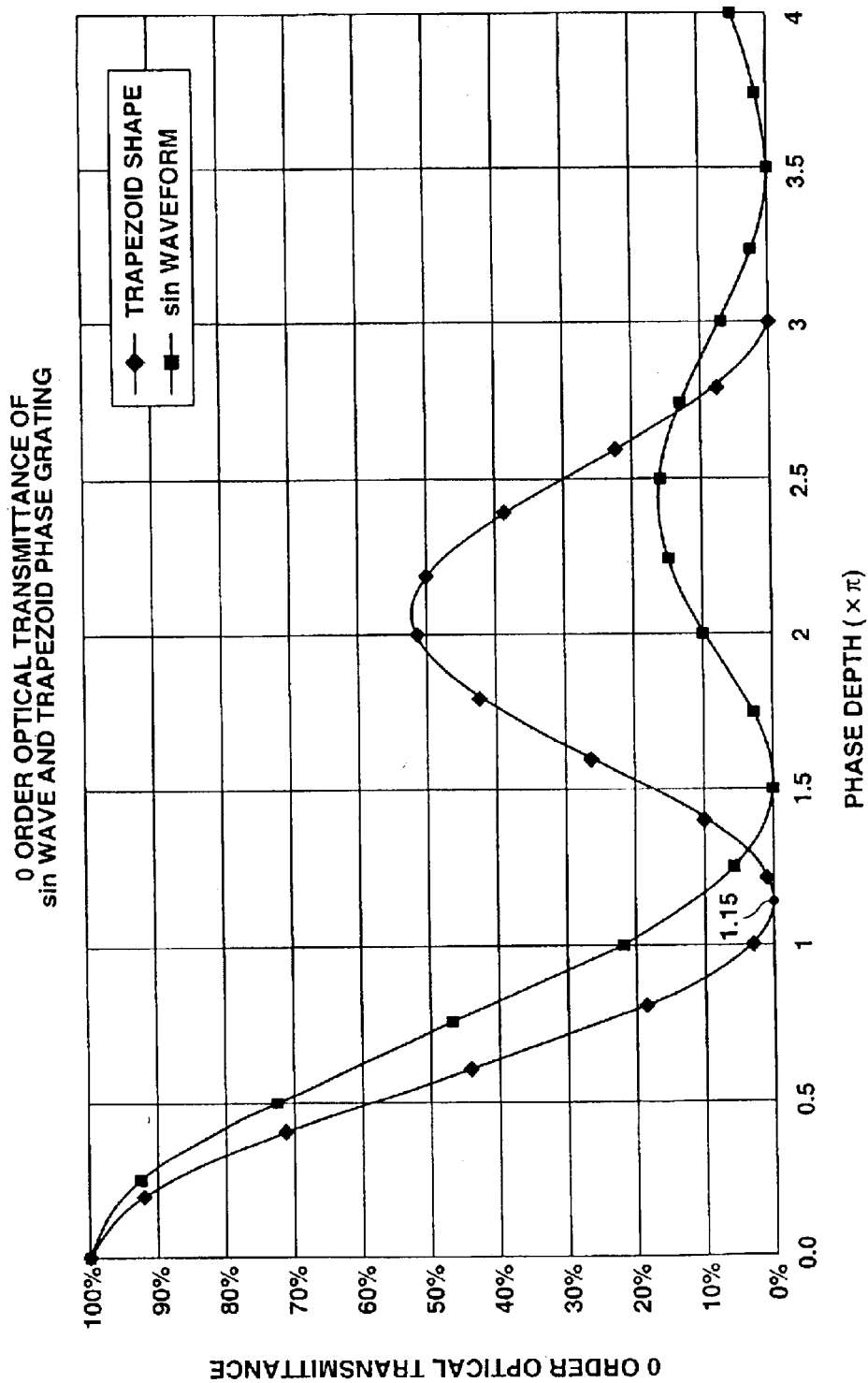
FIG. 24 is a graph for explaining the phase depth of the phase grating of the trapezoid groove and sinusoidal groove against the 0 order optical transmittance characteristic.

FIG. 22 is a diagram showing an example where the shape of the phase grating groove is of a trapezoid shape. FIG. 23 is a diagram showing an example where the shape of the phase grating groove is of a sinusoidal shape. FIG. 24 is a graph simulating the relationship between the groove depth and 0 order optical transmittance of this kind of phase grating having a trapezoid groove and a sinusoidal phase grating.

As shown in FIG. 24, in the case of a phase grating having a sinusoidal groove, the 0 order transmittance decreases from 100% when the groove depth increases, and the 0 order optical transmittance becomes minimum (0%) when the phase depth is 1.5π. Further, when the groove depth is increased, a portion arises in which the 0 order optical transmittance increases gradually. Meanwhile, in the case of a phase grating having a trapezoid groove, the 0 order transmittance decreases from 100% when the groove depth increases, and the 0 order optical transmittance becomes minimum (0%) when the groove depth becomes a phase depth of 1.15π. Further, when the groove depth is increased, a portion arises in which the 0 order optical transmittance increases in the same inclination of the decreasing trend from 100%.

Figure 25:
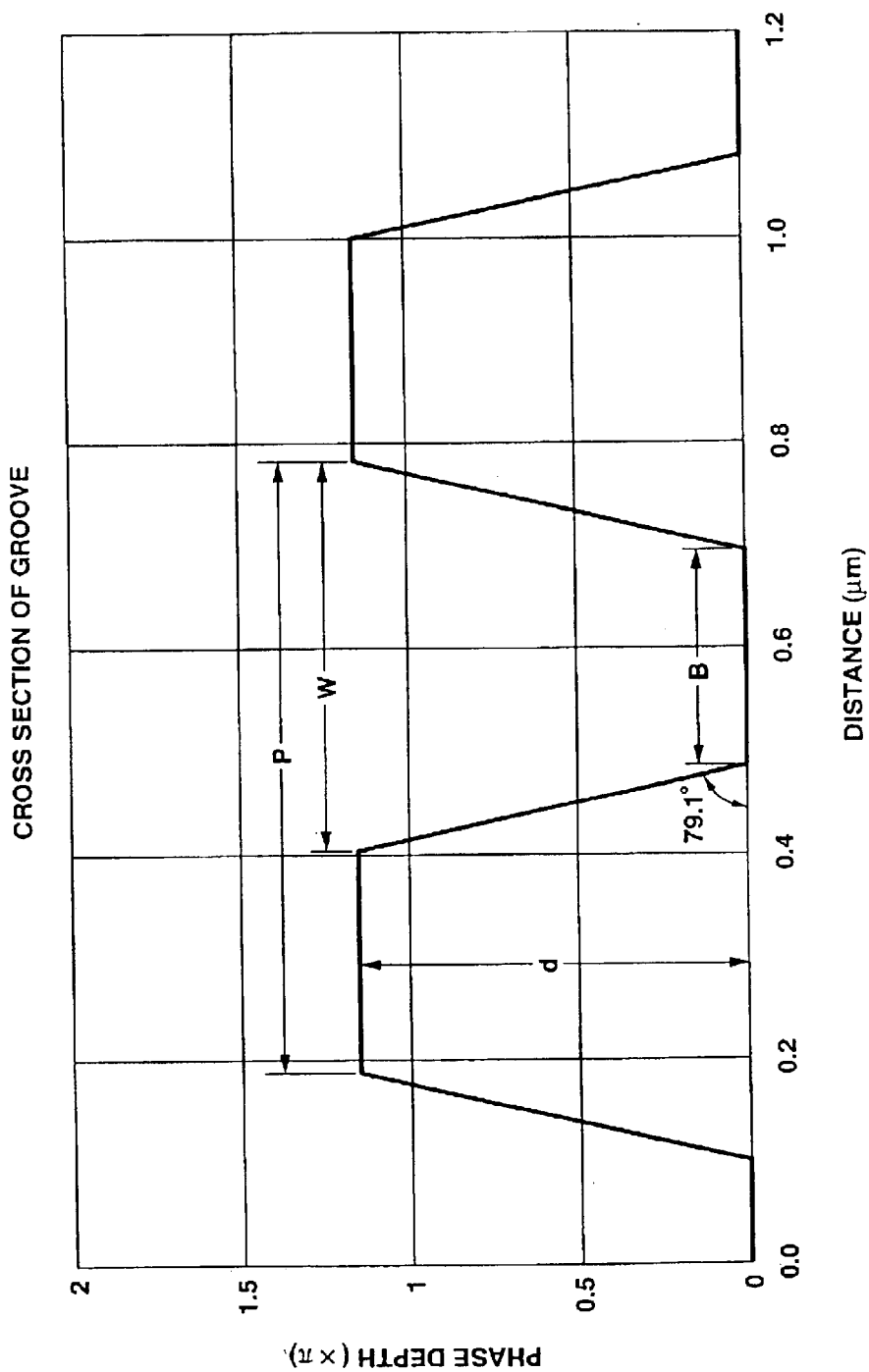
FIG. 25 is an explanatory diagram for explaining an example of another simulated trapezoid groove.
Figure 26:
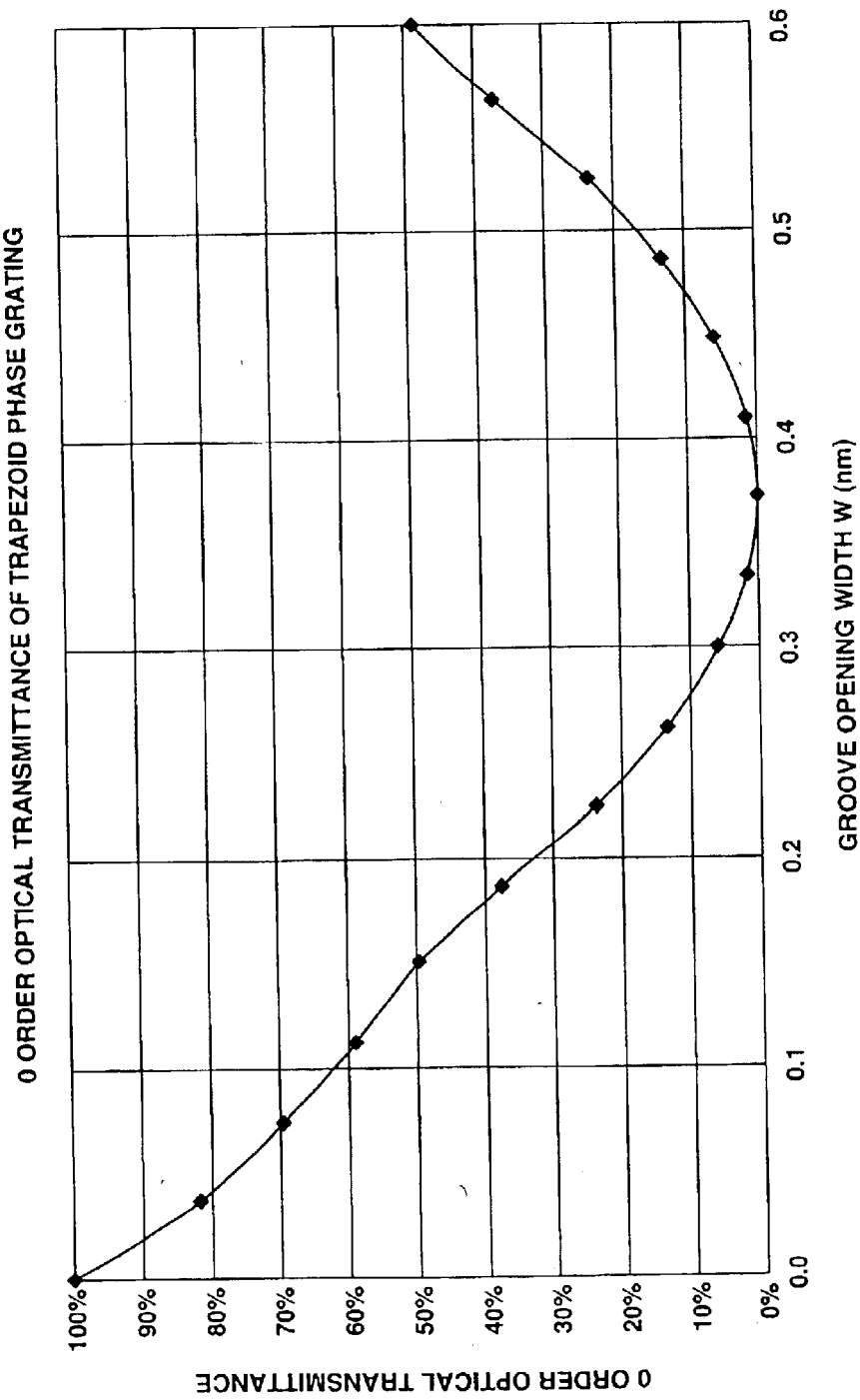
FIG. 26 is a graph for explaining the groove width of the phase grating of the trapezoid groove against the 0 order optical transmittance characteristic.

FIG. 25 and FIG. 26 are graphs showing the simulated relationship of the groove width of the photo grating having a trapezoid groove and the 0 order optical transmittance.

As shown in FIG. 25, the basic shape of the trapezoid groove is set to groove pitch P=0.6 μm, groove opening W=0.375 μm, groove bottom B=0.225 μm, groove face inclination angle=79.1 degrees, and groove depth d=437 μm.

Next, the opening W (and groove bottom B) is changed with the inclined face angle of the groove being fixed, and 0 order optical transmittance against the groove opening width W was simulated. The results are shown in FIG. 26. The 0 order optical transmittance decreases linearly from 100%, and the 0 order optical transmittance became 0% when the opening width W=0.375 μm. Here, the measurement ratio of the groove width and land width was 1:1. Thereafter, the 0 order optical transmittance showed a tendency of increasing linearly in relation to the increase of the opening width W.

Explained below is an example of employing the foregoing phase grating having a trapezoid groove as a mask.

EXAMPLE 1

The manufacturing method of a phase grating mask having a trapezoid groove is now explained with reference to FIG. 3 and FIG. 27.

The photo resist 44 is applied to the quartz substrate 42 at a desired thickness. The thickness here is sought and set through a pilot study such that the ultimate diffraction efficiency can be modulated between 0 and 100%. In this example, the thickness is 480 nm.

This original plate is exposed with the aligner employing a laser device, and a groove having a pitch of 0.6 μm is formed on the photo resist. The exposure is modulated in accordance with the pattern to be drawn, and is set within a range from 0 exposure to an exposure where the 0 order optical transmittance of the prepared phase grating become minimum.

Figure 27:
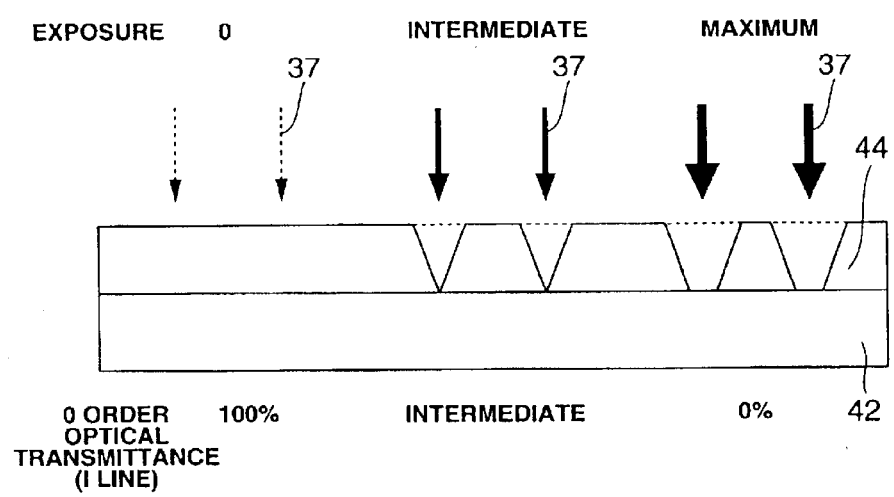
FIG. 27 is an explanatory diagram for explaining the manufacturing process of the phase grating of the trapezoid groove.

As depicted in FIG. 27, when the exposure by the laser beam 37 is small, the cross section shape of the groove in the diameter direction of the original plate will become an approximate V shape. When the exposure exceeds a certain value, the groove bottom within the photo resist 44 reaches the substrate 42, contacts the bottom, and the groove shape changes from a V shape to an approximate trapezoid shape. Here, the groove depth becomes equivalent to the resist film thickness. Further, when the exposure is increased, the width of the trapezoid groove increases. When the groove width and land width become equivalent in the diameter direction, the 0 order optical transmittance of the prepared phase grating will become minimum. When the exposure is intermediate, a 0 order optical transmittance according to such groove shape is obtained.

As described above, the 0 order optical transmittance can be adjusted mainly with the change in the groove depth when the exposure is small, and with the change in the groove width when the exposure is large (c.f. FIG. 24 and FIG. 26).

This substrate is developed in order to eliminate the photo resist 44 of the exposed portion. Dry etching is performed with a reactive gas such as $CHF_3$ with the residual photo resist 44 as the mask, and the photo resist pattern is transcribed on to the quartz substrate 42. Since the selective ratio of the reactive gas quartz and the photo resist etching is 1:1.1, the maximum depth of the transcribed groove will be approximately 437 nm. This is a depth where the phase depth with the i line (wavelength of 365 nm) of the pattern aligner 60 becomes approximately 1.15π. As illustrated in the graph of FIG. 24, the depth of 1.15π is the optimum groove depth for making the 0 order optical transmittance 0%.

Moreover, the groove shape depends on the laser beam (or scanning beam) shape, track pitch, type of resist, and so on. Thus, when the groove shape is not of an accurate trapezoid shape, it is not necessarily the case that the theoretical value of 1.15π shown in the graph of FIG. 24 will be optimum, and a depth matching such groove shape may exist. The optimum film thickness may be sought experimentally for each occasion.

Further, the foregoing two-beam method may also be used for forming the trapezoid groove, and the method to be used may be suitably selected.

EXAMPLE 2

Figure 28:
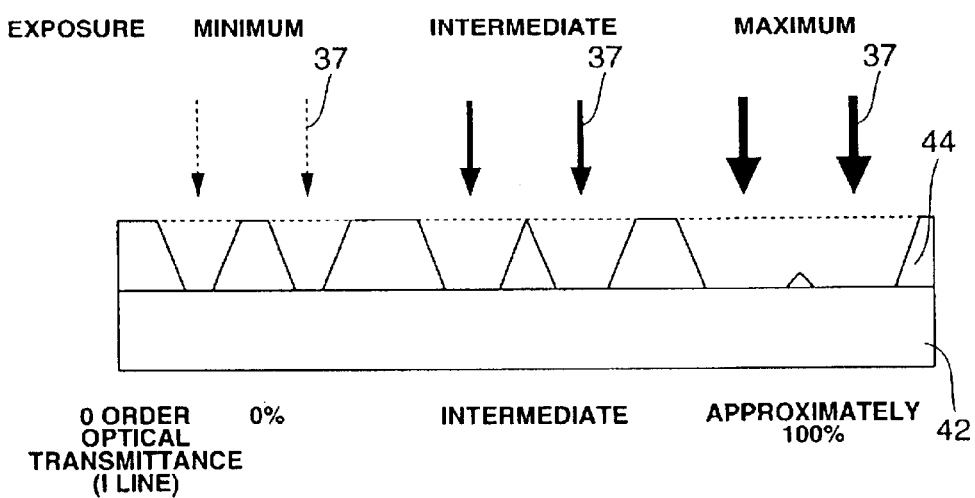
FIG. 28 is an explanatory diagram for explaining the manufacturing process of the phase grating of the trapezoid groove.

In Example 1 of the fourth embodiment described above, when the exposure of the laser beam forming the groove in the photo resist is further increased from the exposure in which the 0 order optical transmittance of the prepared phase grating becomes minimum, as shown in FIG. 28, the width of the groove will become larger than the groove of the land. Then, the 0 order optical transmittance increases once again (c.f. FIG. 26). When the exposure is further increased, the land width decreases, and, ultimately, the land will nearly vanish. The 0 order optical transmittance at this time is near 100%. Thus, it is possible to adjust the transmittance even between the 0 order optical transmittance of 0% to the 0 order optical transmittance of 100% as shown in FIG. 28.

As described above, in the fourth embodiment, the shape of the phase grating groove is formed to have a trapezoid cross section. With a groove having a sinusoidal cross section, when the exposure is changed, since both the depth and width of the groove formed in the photo resist change, the diffraction efficiency of the prepared phase grating mask changes greatly. Thus, it is easy for the reproducibility to become repeatedly inferior, and it is difficult to control the luminous energy. With respect to this point, the trapezoid shape, in comparison to a sinusoidal shape, is able to accurately control the groove depth with the film thickness of the photo resist, and, therefore, the groove depth will not vary as a result of the change in luminous energy, and a phase grating mask having comparatively stable characteristic can be prepared thereby.

Figure 29:
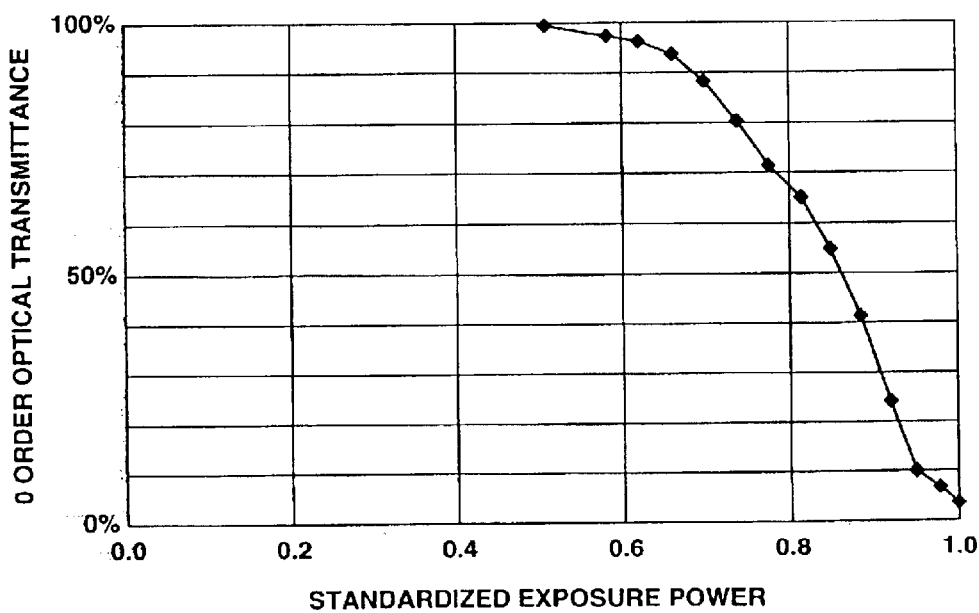
FIG. 29 is a graph for explaining the standardized exposure power of the phase grating of the sinusoidal groove against the 0 order optical transmittance characteristic.
Figure 30:
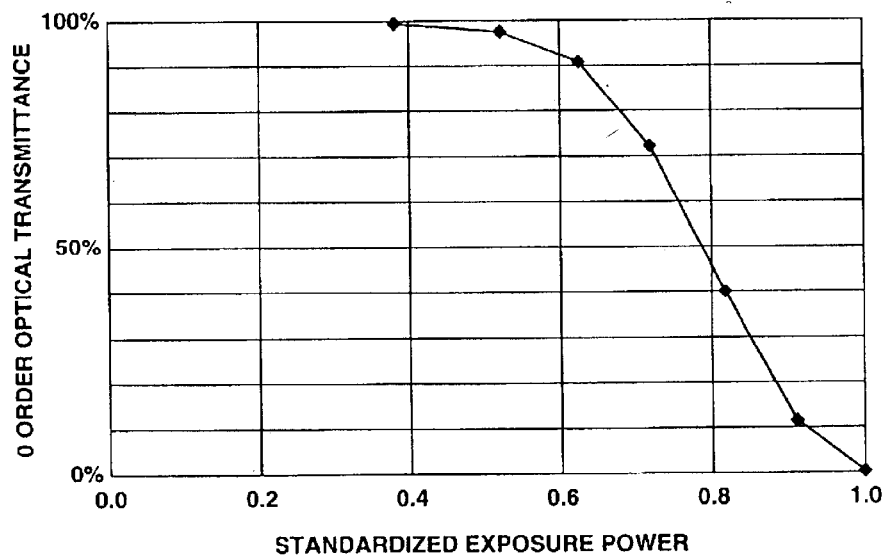
FIG. 30 is a graph for explaining the standardized exposure power of the phase grating of the trapezoid groove against the 0 order optical transmittance characteristic.
Figure 31:
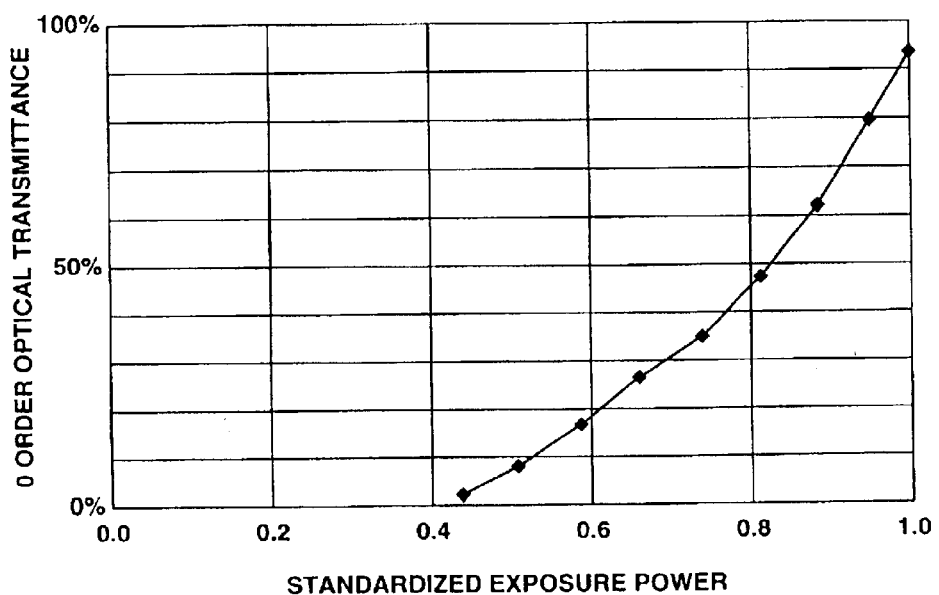
FIG. 31 is a graph for explaining the standardized exposure power of another phase grating of the trapezoid groove against the 0 order optical transmittance characteristic.

FIGS. 29 to 31 are graphs showing the relationship of the exposure power and the 0 order optical transmittance of the phase grating prepared with the method of Examples 1 and 2 with a sinusoidal cross section groove and a trapezoid cross section groove described above. The standardized exposure power shows the amount of exposure with the exposure as 1 where the 0 order optical transmittance is 0%.

With the phase grating having a sinusoidal groove, the groove width is relatively narrow, and there is an advantage in that the resolution can be improved easily. With Example 1 using the trapezoid groove from a V shaped groove, there is an advantage in that the amount of exposure can be minimal. With Example 2 where the groove width is increased with the groove of the trapezoid groove being fixed, the relationship between the exposure and 0 order optical transmittance is direct, numerous number of tones can be obtained, and there is an advantage in that the S/N is high and strong against noise since the exposure power is large.

Figure 32:
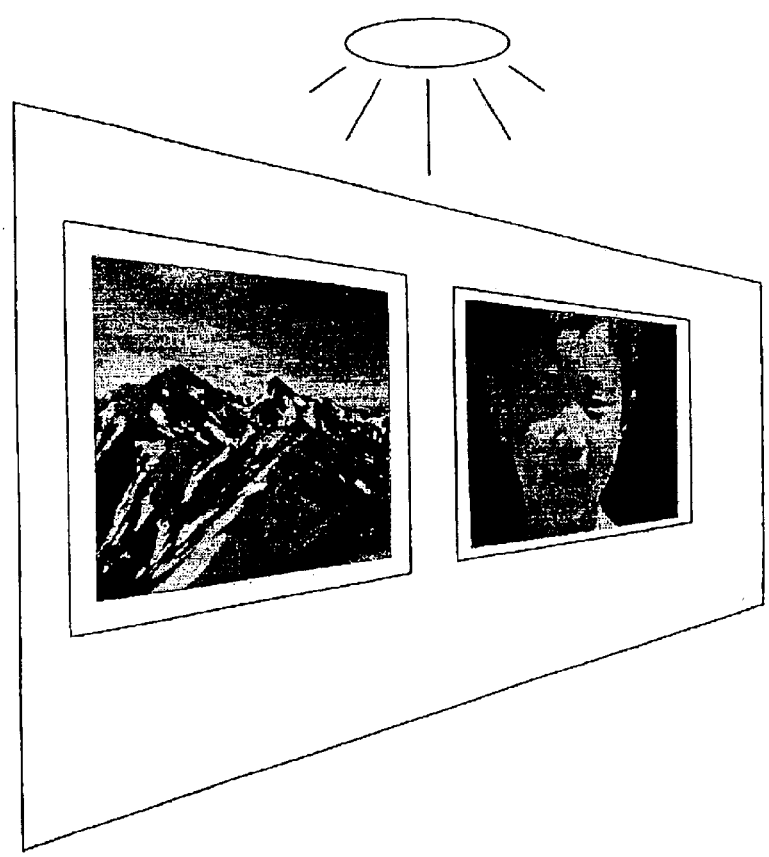
FIG. 32 is an explanatory diagram for explaining an application example of the phase grating mask.

FIG. 32 shows an application of the phase grating mask of the present invention. The phase grating mask may be used as the patterning mask of a microstructure, and, since the phase grating mask of the present invention is able to represent a halftone, as illustrated in FIG. 32, this may be used as a display medium such as a photograph, painting, poster, advertisement article, printed material (graphic representation), and so on.

Figure 33:
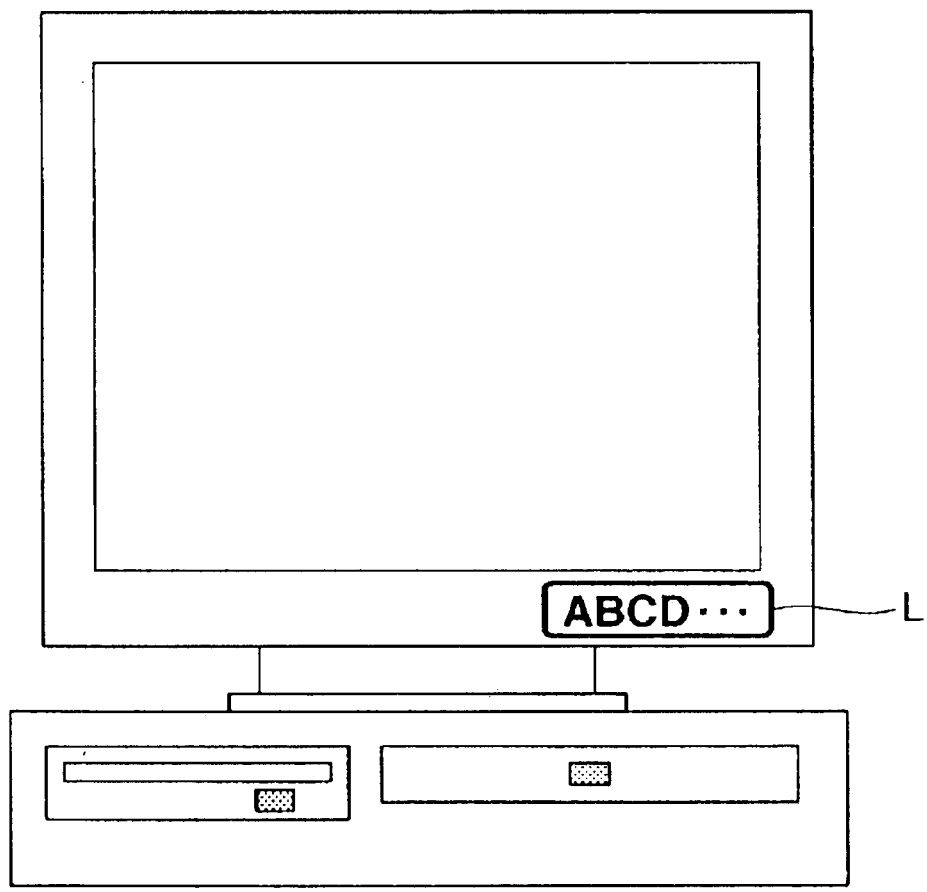
FIG. 33 is an explanatory diagram for explaining another application example of the phase grating mask.

Moreover, as depicted in FIG. 33, this may also be used as a logo mark L of products.

The phase grating mask of the present invention is able to display a light and shade with only the shape, and, since the condition and color of the light and shade changes depending on the viewing angle, a unique display as with a hologram becomes possible. When using the phase grating mask as a display medium to be visually recognized by a person, the function of displaying the light and shade is exhibited even when the grating pitch P is wider than the wavelength λ of the illumination. This is because the entrance pupil NA in the P<λ<NA is determined by the size of the human pupil, and the λ/NA will become an extremely small value.

As described above, conventionally, it was necessary to narrow the track pitch in order to improve the mask resolution. Nevertheless, when the track pitch is narrowed and approaches the optical resolving power, the cross section of the exposure pattern approaches a sinusoidal wave. In this kind of area, the threshold is vague as a pattern for the conventional binary mask, and cannot be used.

With respect to this point, the photomask of the first embodiment is able to actively use the groove having a sinusoidal cross section in this narrow track pitch, and it is possible to narrow the track pitch in comparison to conventional methods, and a high resolution mask can be obtained thereby. In addition, with a conventional binary mask, the positional precision and resolving power of the dots affected the resolution of the photomask, and this will not occur with the photomask of the examples, which is favorable.

Moreover, although the Examples were explained taking a photomask of the microlens as an example, the present invention is not limited thereto, and may be employed in the manufacture of a microstructures such as a microlens array, reflecting plate, optical waveguide, indicator, and so on.

In the present embodiment, although the mask is actually used in only a part of the area within the substrate, the face of the substrate may be the mask area in its approximate entirety.

As described above, according to the photomask, manufacturing method of the mask, and the aligner of the present invention, a high resolution mask and microstructure capable of performing halftone exposure can be obtained.

What is claimed is:

1. A photomask, comprising:
   a transparent substrate; and
   a phase grating structured from a plurality of grooves of a fixed pitch formed on one face of said substrate;
   wherein at least either the depth or width of the respective grooves of said phase grating determines the 0 order optical transmittance of the exposed light that vertically crosses one face of said substrate; and
   wherein the 0 order optical transmittance setting at said grooves forms the exposure pattern.

2. A photomask according to claim 1, wherein when said pitch is set to P, the wavelength of the exposed light of the aligner employing said photomask is set to λ, and the incident side numerical aperture of the imaging system lens is set to $NA_i$, $P<\lambda/NA_i$.

3. A photomask according to claim 2, wherein the cross section of the groove of said phase grating is of an approximate sinusoidal shape, and the phase depth in said exposed light of this groove is within the range of 0 to $1.5\pi$.

4. A photomask according to claim 2, wherein the groove of said phase grating is of an approximate trapezoid shape, and the shape of this groove is within the range of a shape in which the 0 order optical transmittance becomes minimum in the wavelength of the exposed light from an approximate planar surface.

5. A photomask according to claim 1, wherein the plurality of grooves of said phase grating are formed with rotational scanning.

6. A photomask according to claim 1, wherein, with respect to the plurality of grooves of said phase grating, the depth or width of said grooves is formed by modulating the intensity of the scanning beam.

7. A photomask according to claim 1, wherein, with respect to the plurality of grooves of said phase grating, the depth or width of said grooves is formed by repeated irradiation with one or a plurality of scanning beams for forming one groove, or by increasing the scanning density with one or a plurality of scanning beams for forming one groove.

8. A microstructure, comprising:
   a transparent substrate; and
   a phase grating structured from a plurality of grooves of a fixed pitch formed on one face of said substrate;
   wherein said microstructure is formed to correspond to the tone of the pattern to be displayed with at least either the depth or width of the respective grooves of said phase grating;
   wherein at least either the depth or width of the respective grooves of said phase grating determines the 0 order optical transmittance of the exposed light that vertically crosses one face of said substrate; and
   wherein the 0 order optical transmittance setting at said grooves forms the exposure pattern.

9. A microstructure according to claim 8, wherein said microstructure includes one among a microlens, reflecting plate, optical waveguide, photomask, crystal panel, semiconductor substrate, microelectronics mechanical system (MEMS) substrate, diffraction grating, hologram, optical communication device, display medium of a graphic expression object, or indicator.

10. A manufacturing method of a phase grating mask, comprising:

a step for forming a resist on a mask substrate;
an exposure step for forming on said resist a latent image of the phase grating mask containing a plurality of grooves in prescribed intervals;
a development step for developing said resist and forming a phase grating resist; and
a transcription step for transcribing the shape of said phase grating resist on said mask substrate;
wherein said exposure step scans said resist and sets the depth of the exposure groove formed on said resist with the exposure beam in which the intensity thereof has been modulated in correspondence with the pattern of said phase grating mask;
wherein at least either the depth or width of the respective grooves of said phase grating determines the 0 order optical transmittance of the exposed light that vertically crosses one face of said substrate:
wherein the 0 order optical transmittance setting at said grooves forms the exposure pattern.

11. A manufacturing method of a phase grating mask according to claim 10, wherein said scanning is a rotational scanning system.

12. A manufacturing method of a phase grating mask according to claim 10, wherein the prescribed interval P of the plurality of grooves of said phase grating mask is set to $P < \lambda/NA_i$ when the wavelength of the exposed light of the aligner irradiating said phase grating mask is set to $\lambda$, and the incident side numerical aperture of the imaging system lens is set to $NA_i$.

13. A manufacturing method of a phase grating mask according to claim 12, wherein the cross section of the exposure groove formed on said resist is of an approximate sinusoidal shape, and the phase depth in said exposed light of this groove is within the range of 0 to $1.5\pi$.

14. A manufacturing method of a phase grating mask according to claim 12, wherein the groove of said phase grating is of an approximate trapezoid shape, and the shape of this groove is within the range of a shape in which the 0 order optical transmittance becomes minimum in the wavelength of the exposed light from an approximate planar surface.

15. A manufacturing method of a phase grating mask according to claim 10, wherein said resist is a positive type, and the amount of light exposed to this resist with said exposure beam is made to be within a range from a luminous exposure in which the 0 order transmittance of the prepared phase grating becomes minimum to a luminous exposure in which said 0 order transmittance becomes maximum.

16. A manufacturing method of a phase grating mask according to claim 10, wherein said resist is a positive type, and the amount of light exposed to this resist with said exposure beam is made to be within a range from a luminous exposure in which the 0 order transmittance of the prepared phase grating becomes minimum to a luminous exposure in which said resist is eliminated in its approximate entirety pursuant to the development thereof.

17. A manufacturing method of a phase grating mask, comprising:
a step for forming a resist on a mask substrate;
an exposure step for forming on said resist a latent image of the phase grating mask containing a plurality of grooves in prescribed intervals;
a development step for developing said resist and forming a phase grating resist; and
a transcription step for transcribing the shape of said phase grating resist on said mask substrate;
wherein said exposure step scans said resist and sets the depth of the exposure groove formed on said resist with at least two exposure beams in which is provided an intensity difference in correspondence with the pattern of said phase grating mask;
wherein at least either the depth or width of the respective grooves of said phase grating determines the 0 order optical transmittance of the exposed light that vertically crosses one face of said substrate;
wherein the 0 order optical transmittance setting at said grooves forms the exposure pattern.

18. A manufacturing method of a phase grating mask according to claim 17, wherein among said two exposure beams, a first exposure groove having a first depth is formed with a first exposure beam, a second exposure groove having a second depth is formed with a second exposure beam, and the depth of said exposure grooves is relatively set according to the difference in the formed position of said first and second exposure grooves.

19. A manufacturing method of a phase grating mask according to claim 18, wherein among said two exposure beams, the first exposure beam is maintained at a fixed intensity, and the intensity of the second exposure beam is modulated in correspondence with the pattern of said phase grating mask.

20. A manufacturing method of a phase grating mask according to claim 17, wherein among said two exposure beams, the first exposure beam forms an exposure groove of a fixed depth in said resist, and said second exposure beam sets the height of the land portion adjacent to this exposure groove.

21. A manufacturing method of a phase grating mask according to claim 17, wherein the respective intensities of said two exposure beams are independently set, and these two exposure beams simultaneously scan said resist.

22. A manufacturing method of a phase grating mask according to claim 17, wherein said first and second exposure beams are obtained by changing the mode upon setting the intensity of one exposure beam for each scanning.

23. A manufacturing method of a phase grating mask according to claim 17, wherein the spot diameter of said exposure beam is smaller than the groove interval of said phase grating mask and larger than ½ of the groove interval.

24. A manufacturing method of a phase grating mask according to claim 17, wherein the intensity of both said first and second exposure beams is made large to form a shallow groove on said resist.

25. A manufacturing method of a phase grating mask according to claim 17, wherein said scanning is a rotational scanning system.

26. A manufacturing method of a phase grating mask according to claim 17, wherein the prescribed interval P of the plurality of grooves of said phase grating mask is set to $P < \lambda/NA_i$ when the wavelength of the exposed light of the aligner irradiating said phase grating mask is set to $\lambda$, and the incident side numerical aperture of the imaging system lens is set to $NA_i$.

27. A manufacturing method of a phase grating mask according to claim 26, wherein the cross section of the exposure groove formed on said resist is of an approximate sinusoidal shape, and the phase depth in said exposed light of this groove is within the range of 0 to $1.5\pi$.

28. A manufacturing method of a phase grating mask according to claim 26, wherein the groove of said phase grating is of an approximate trapezoid shape, and the shape of this groove is within the range of a shape in which the 0 order optical transmittance becomes minimum in the wavelength of the exposed light from an approximate planar surface.

29. A manufacturing method of a phase grating mask according to claim 17, wherein said resist is a positive type, and the amount of light exposed to this resist with said exposure beam is made to be within a range from a luminous exposure in which the 0 order transmittance of the prepared phase grating becomes minimum to a luminous exposure in which said 0 order transmittance becomes maximum.

30. A manufacturing method of a phase grating mask according to claim 17, wherein said resist is a positive type, and the amount of light exposed to this resist with said exposure beam is made to be within a range from a luminous exposure in which the 0 order transmittance of the prepared phase grating becomes minimum to a luminous exposure in which said resist is eliminated in its approximate entirety pursuant to the development thereof.

31. A manufacturing method of a phase grating mask, comprising:

a step for forming a resist on a mask substrate;

an exposure step for forming on said resist a latent image of the phase grating mask containing a plurality of grooves in prescribed intervals;

a development step for developing said resist and forming a phase grating resist; and a transcription step for transcribing the shape of said phase grating resist on said mask substrate;

wherein said exposure step scans said resist with the two exposure beams, sets the interval of the two exposure beams for irradiating said resist in correspondence with the pattern of said phase grating mask, and sets the width of the exposure groove formed on said resist;

wherein at least either the depth or width of the respective grooves of said phase grating determines the 0 order optical transmittance of the exposed light that vertically crosses one face of said substrate;

wherein the 0 order optical transmittance setting at said grooves forms the exposure pattern.

32. A manufacturing method of a phase grating mask according to claim 31, wherein said two exposure beams are obtained by changing the irradiation direction of one exposure beam for each scanning.

33. A manufacturing method of a phase grating mask according to claim 31, wherein the respective irradiation directions of said two exposure beams are set symmetrically, and these two exposure beams simultaneously scan said resist.

34. A manufacturing method of a phase grating mask according to claim 31, wherein the intensity of both said first and second exposure beams is made large to form a shallow groove.

35. A manufacturing method of a phase grating mask according to claim 31, wherein said scanning is a rotational scanning system.

36. A manufacturing method of a phase grating mask according to claim 31, wherein the prescribed interval P of the plurality of grooves of said phase grating mask is set to $P<\lambda/NA_i$ when the wavelength of the exposed light of the aligner irradiating said phase grating mask is set to $\lambda$, and the incident side numerical aperture of the imaging system lens is set to $NA_i$.

37. A manufacturing method of a phase grating mask according to claim 36, wherein the cross section of the exposure groove formed on said resist is of an approximate sinusoidal shape, and the phase depth in said exposed light of this groove is within the range of 0 to $1.5\pi$.

38. A manufacturing method of a phase grating mask according to claim 36, wherein the groove of said phase grating is of an approximate trapezoid shape, and the shape of this groove is within the range of a shape in which the 0 order optical transmittance becomes minimum in the wavelength of the exposed light from an approximate planar surface.

39. A manufacturing method of a phase grating mask according to claim 31, wherein said resist is a positive type, and the amount of light exposed to this resist with said exposure beam is made to be within a range from a luminous exposure in which the 0 order transmittance of the prepared phase grating becomes minimum to a luminous exposure in which said 0 order transmittance becomes maximum.

40. A manufacturing method of a phase grating mask according to claim 31, wherein said resist is a positive type, and the amount of light exposed to this resist with said exposure beam is made to be within a range from a luminous exposure in which the 0 order transmittance of the prepared phase grating becomes minimum to a luminous exposure in which said resist is eliminated in its approximate entirety pursuant to the development thereof.

41. A manufacturing method of a phase grating mask, comprising:

a step for forming a resist on a mask substrate;

an exposure step for forming on said resist a latent image of the phase grating mask containing a plurality of grooves in prescribed intervals;

a development step for developing said resist and forming a phase grating resist; and a transcription step for transcribing the shape of said phase grating resist on said mask substrate;

wherein said exposure step scans said resist with the two exposure beams, sets the angle formed with the two exposure beams for irradiating said resist in correspondence with the pattern of said phase grating mask, and sets the depth and width of the exposure groove formed on said resist;

wherein at least either the depth or width of the respective grooves of said phase grating determines the 0 order optical transmittance of the exposed light that vertically crosses one face of said substrate;

wherein the 0 order optical transmittance setting at said grooves forms the exposure pattern.

42. A manufacturing method of a phase grating mask according to claim 41, wherein said two exposure beams are obtained by changing the irradiation direction of one exposure beam for each scanning.

43. A manufacturing method of a phase grating mask according to claim 41, wherein the respective irradiation directions of said two exposure beams are set symmetrically, and these two exposure beams simultaneously scan said resist.

44. A manufacturing method of a phase grating mask according to claim 41, wherein the intensity of both said first and second exposure beams is made large to form a shallow groove.

45. A manufacturing method of a phase grating mask according to claim 41, wherein said scanning is a rotational scanning system.

46. A manufacturing method of a phase grating mask according to claim 31, wherein the prescribed interval P of the plurality of grooves of said phase grating mask is set to $P<\lambda/NA_i$ when the wavelength of the exposed light of the aligner irradiating said phase grating mask is set to $\lambda$, and the incident side numerical aperture of the imaging system lens is set to $NA_i$.

47. A manufacturing method of a phase grating mask according to claim 46, wherein the cross section of the exposure groove formed on said resist is of an approximate sinusoidal shape, and the phase depth in said exposed light of this groove is within the range of 0 to 1.5π.

48. A manufacturing method of a phase grating mask according to claim 46, wherein the groove of said phase grating is of an approximate trapezoid shape, and the shape of this groove is within the range of a shape in which the 0 order optical transmittance becomes minimum in the wavelength of the exposed light from an approximate planar surface.

49. A manufacturing method of a phase grating mask according to claim 41, wherein said resist is a positive type, and the amount of light exposed to this resist with said exposure beam is made to be within a range from a luminous exposure in which the 0 order transmittance of the prepared phase grating becomes minimum to a luminous exposure in which said 0 order transmittance becomes maximum.

50. A manufacturing method of a phase grating mask according to claim 41, wherein said resist is a positive type, and the amount of light exposed to this resist with said exposure beam is made to be within a range from a luminous exposure in which the 0 order transmittance of the prepared phase grating becomes minimum to a luminous exposure in which said resist is eliminated in its approximate entirety pursuant to the development thereof.

51. An aligner, comprising:
a phase grating photomask in which at least either the depth or width of the respective grooves of said phase grating bears the mask pattern;
an exposure light source for irradiating the exposure light on said photomask;
a material for exposure to which a light sensitive film is applied thereto; and projection means for condensing the 0 order light of said phase grating among the exposed light transmitted through said photomask on to said material for exposure;
wherein at least either the death or width of the respective grooves of said phase grating determines the 0 order optical transmittance of the exposed light that vertically crosses one face of said substrate;
wherein the 0 order optical transmittance setting at said grooves forms the exposure pattern.

52. An aligner according to claim 51, wherein when said pitch is set to P, the wavelength of the exposed light of the aligner employing said photomask is set to $\lambda$, and the incident side numerical aperture of the imaging system lens is set to $NA_i$, $P<\lambda/NA_i$.

53. An aligner according to claim 51, wherein said projection means projects only said 0 order light on to said material for exposure, and does not project any high order light above first order light; and
said photomask determines the diffraction efficiency of said 0 order light with at least either the depth or width of the respective grooves of said phase grating, and provides an exposure tone in correspondence with said mask pattern to said light sensitive film.

54. An aligner according to claim 51, wherein the cross section of the groove of said phase grating is of an approximate sinusoidal shape, and the phase depth in said exposed light of this groove is within the range of 0 to 1.5π.

55. An aligner according to claim 51, wherein the groove of said phase grating is of an approximate trapezoid shape, and the shape of this groove is within the range of a shape in which the 0 order optical transmittance becomes minimum in the wavelength of the exposed light from an approximate planar surface.

56. A microstructure manufactured with the manufacturing method of a phase grating mask according to claim 10.

57. A microstructure manufactured with the manufacturing method of a phase grating mask according to claim 17.

58. A microstructure manufactured with the manufacturing method of a phase grating mask according to claim 31.

59. A microstructure manufactured with the manufacturing method of a phase grating mask according to claim 41.

60. A microstructure manufactured with the manufacturing method of a phase grating mask according to claim 51.

* * * * *